United States Patent
Kay et al.

(10) Patent No.: US 8,981,839 B2
(45) Date of Patent: Mar. 17, 2015

(54) POWER SOURCE MULTIPLEXER

(71) Applicant: RF Micro Devices, Inc., Greensboro, NC (US)

(72) Inventors: Michael R. Kay, Summerfield, NC (US); Manbir Singh Nag, Oak Ridge, NC (US); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/914,888

(22) Filed: Jun. 11, 2013

(65) Prior Publication Data

US 2013/0328613 A1 Dec. 12, 2013

Related U.S. Application Data

(60) Provisional application No. 61/658,013, filed on Jun. 11, 2012.

(51) Int. Cl.
*G05F 1/10* (2006.01)
*H03K 17/687* (2006.01)

(52) U.S. Cl.
CPC .................................. *H03K 17/687* (2013.01)
USPC .............. 327/538; 307/43; 320/138; 327/408

(58) Field of Classification Search
USPC ...................... 327/538, 408; 307/43; 320/138
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |

(Continued)

FOREIGN PATENT DOCUMENTS

| | | |
|---|---|---|
| CN | 1211355 A | 3/1999 |
| CN | 101201891 A | 6/2008 |

(Continued)

OTHER PUBLICATIONS

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

(Continued)

*Primary Examiner* — Ryan Jager
(74) *Attorney, Agent, or Firm* — Withrow & Terranova, P.L.L.C.

(57) ABSTRACT

Circuitry, which includes a first switching transistor element having a first gate, a second switching transistor element having a second gate, a third switching transistor element having a third gate, and a fourth switching transistor element having a fourth gate, is disclosed. The first switching transistor element and the third switching transistor element are coupled in series between a first power source and a first downstream circuit. The second switching transistor element and the fourth switching transistor element are coupled in series between a second power source and the first downstream circuit. A voltage swing at the first gate and a voltage swing at the second gate are both about equal to a first voltage magnitude. A voltage swing at the third gate and a voltage swing at the fourth gate are both about equal to a second voltage magnitude.

29 Claims, 13 Drawing Sheets

(56) References Cited

U.S. PATENT DOCUMENTS

| | | |
|---|---|---|
| 4,996,500 A | 2/1991 | Larson et al. |
| 5,099,203 A | 3/1992 | Weaver et al. |
| 5,146,504 A | 9/1992 | Pinckley |
| 5,187,396 A * | 2/1993 | Armstrong et al. ............ 327/65 |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A * | 10/2000 | Savelli .................... 327/410 |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 * | 5/2003 | Renous .................... 327/408 |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 * | 6/2004 | Jackson et al. .................. 307/43 |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,200,365 B2 | 4/2007 | Watanabe et al. |
| 7,233,130 B1 | 6/2007 | Kay |
| 7,253,589 B1 * | 8/2007 | Potanin et al. ............... 320/138 |
| 7,254,157 B1 * | 8/2007 | Crotty et al. .................. 375/132 |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 * | 8/2008 | Chen .............................. 307/43 |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 * | 10/2011 | Tamegai et al. ............... 320/138 |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 * | 3/2004 | Jackson et al. .................. 307/43 |
| 2004/0124913 A1 | 7/2004 | Midya et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |

(56) References Cited

U.S. PATENT DOCUMENTS

| | | |
|---|---|---|
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1* | 1/2007 | Lu et al. ............... 365/230.03 |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 0755121 A2 | 1/1997 |
| EP | 1492227 A1 | 12/2004 |
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/602,856, mailed Sep. 24, 2013, 9 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Non-Final Office Action for U.S. Appl. No. 14/022,940, mailed Dec. 20, 2013, 5 pages.

(56) References Cited

OTHER PUBLICATIONS

International Search Report and Written Opinion for PCT/US2013/052277, mailed Jan. 7, 2014, 14 pages.
Notice of Allowance for U.S. Appl. No. 13/531,719, mailed Dec. 30, 2013, 7 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al, "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Notice of Allowance for U.S. Appl. No. 12/836,307 mailed May 5, 2014, 6 pages.
Examination Report for European Patent Application No. 11720630.0 issued Mar. 18, 2014, 4 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/486,012, mailed Jul. 28, 2014, 7 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Non-Final Office Action for U.S. Appl. No. 13/684,826 mailed Apr. 3, 2014, 5 pages.
Notice of Allowance for U.S. Appl. No. 13/684,826, mailed Jul. 18, 2014, 7 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/951,976 mailed Apr. 4, 2014, 7 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
International Preliminary Report on Patentability for PCT/US2012/024124, mailed Aug. 22, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/023495, mailed Aug. 15, 2013, 10 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^ at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applica-

(56) References Cited

OTHER PUBLICATIONS tions," 2010 IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
European Search Report for Patent Application No. 14162682.0, issued Aug. 27, 2014, 7 pages.
Invitation to Pay Additional Fees and Partial International Search Report for PCT/US2014/028178, mailed Jul. 24, 2014, 7 pages.
First Office Action for Chinese Patent Application No. 201280026559.0, issued Nov. 3, 2014, 14 pages (with English translation).
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Non-Final Office Action for U.S. Appl. No. 13/747,725, mailed Oct. 7, 2014, 6 pages.

\* cited by examiner

POWER SOURCE MULTIPLEXER

RELATED APPLICATIONS

This application claims the benefit of U.S. provisional patent application No. 61/658,013, filed Jun. 11, 2012, the disclosure of which is incorporated herein by reference in its entirety.

FIELD OF THE DISCLOSURE

Embodiments of the present disclosure relate to circuits that are powered using power sources and circuits that interface the power sources to the circuits that are powered using the power sources.

BACKGROUND

Certain circuits may be powered from different power sources depending upon specific operating conditions. For example, a circuit may be powered from one power source when operating within a certain input power range and may be powered from another power source when operating within another input power range. Thus, there is a need for a circuit, which is used to direct power from at least one of at least two power sources to a circuit based upon specific operating conditions.

SUMMARY

Circuitry, which includes a first switching transistor element having a first gate, a second switching transistor element having a second gate, a third switching transistor element having a third gate, and a fourth switching transistor element having a fourth gate, is disclosed. The first switching transistor element and the third switching transistor element are coupled in series between a first power source and a first downstream circuit. The second switching transistor element and the fourth switching transistor element are coupled in series between a second power source and the first downstream circuit. A voltage swing at the first gate is about equal to a first voltage magnitude. A voltage swing at the second gate is about equal to the first voltage magnitude. A voltage swing at the third gate is about equal to a second voltage magnitude. A voltage swing at the fourth gate is about equal to the second voltage magnitude.

In one embodiment of the circuitry, the first voltage magnitude is about equal to a magnitude of an output voltage from the first power source, and the second voltage magnitude is about equal to a magnitude of an output voltage from the second power source. In one embodiment of the circuitry, the first switching transistor element, the second switching transistor element, the third switching transistor element, and the fourth switching transistor element form a power source multiplexer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
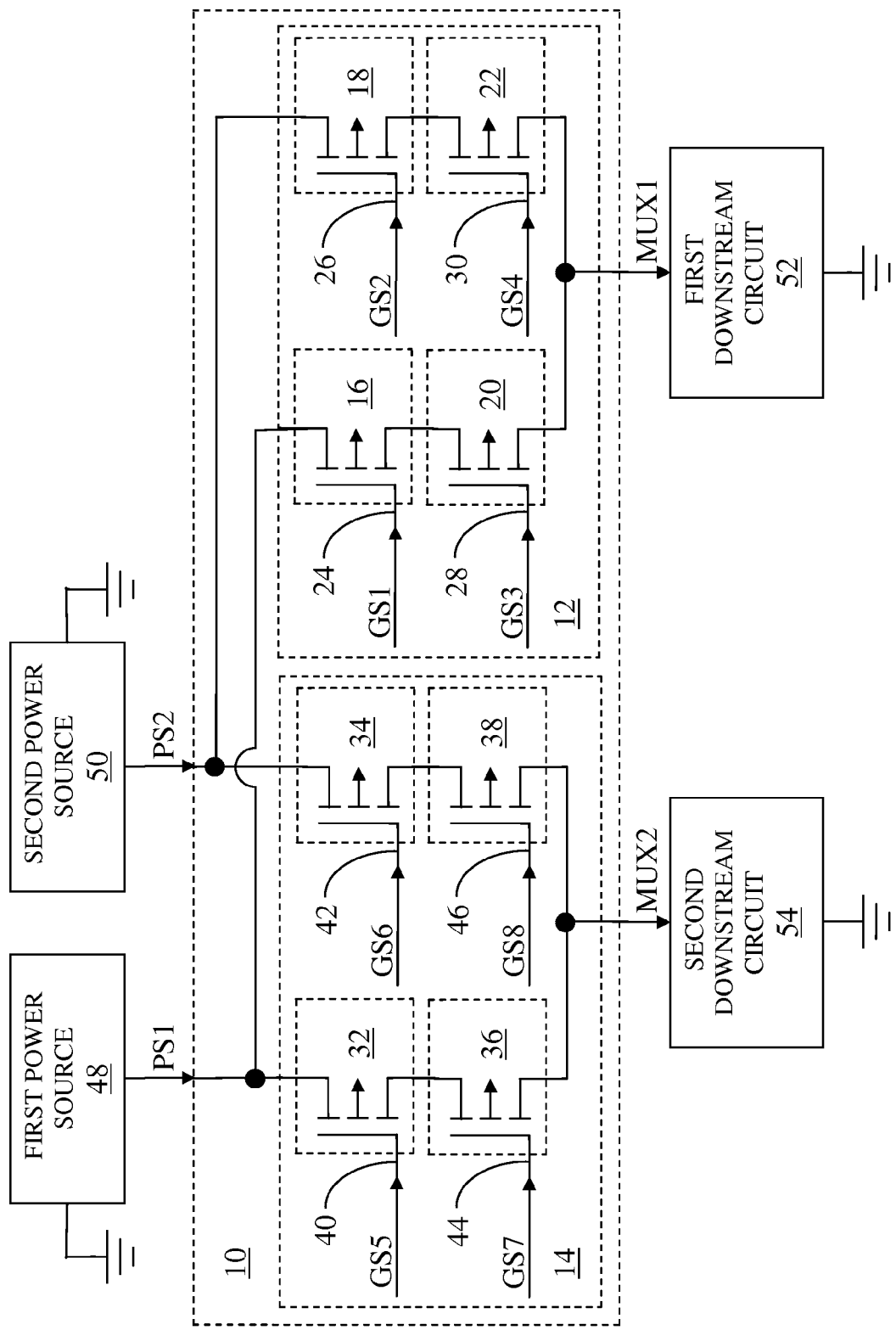
FIG. 1 shows circuitry according to one embodiment of the present disclosure.

FIG. 1 shows circuitry 10 according to one embodiment of the present disclosure. The circuitry 10 includes a first power source multiplexer 12 and a second power source multiplexer 14. As such, structures of the first power source multiplexer 12 and the second power source multiplexer 14 are presented. The first power source multiplexer 12 includes a first switching transistor element 16, a second switching transistor element 18, a third switching transistor element 20, and a fourth switching transistor element 22. The first switching transistor element 16 has a first gate 24, the second switching transistor element 18 has a second gate 26, the third switching transistor element 20 has a third gate 28, and the fourth switching transistor element 22 has a fourth gate 30. The first gate 24 receives a first gate signal GS1, the second gate 26 receives a second gate signal GS2, the third gate 28 receives a third gate signal GS3, and the fourth gate 30 receives a fourth gate signal GS4.

The second power source multiplexer 14 includes a fifth switching transistor element 32, a sixth switching transistor element 34, a seventh switching transistor element 36, and an eighth switching transistor element 38. The fifth switching transistor element 32 has a fifth gate 40, the sixth switching transistor element 34 has a sixth gate 42, the seventh switching transistor element 36 has a seventh gate 44, and the eighth switching transistor element 38 has an eighth gate 46. The fifth gate 40 receives a fifth gate signal GS5, the sixth gate 42 receives a sixth gate signal GS6, the seventh gate 44 receives a seventh gate signal GS7, and the eighth gate 46 receives an eighth gate signal GS8.

A first power source 48 is coupled to both the first power source multiplexer 12 and the second power source multiplexer 14. A second power source 50 is coupled to both the first power source multiplexer 12 and the second power source multiplexer 14. The first power source multiplexer 12 is coupled to a first downstream circuit 52. The second power source multiplexer 14 is coupled to a second downstream circuit 54. In another embodiment of the circuitry 10, the second power source multiplexer 14 and the second downstream circuit 54 are both omitted.

The first switching transistor element 16 and the third switching transistor element 20 are coupled in series between the first power source 48 and the first downstream circuit 52. The second switching transistor element 18 and the fourth switching transistor element 22 are coupled in series between the second power source 50 and the first downstream circuit 52. The fifth switching transistor element 32 and the seventh switching transistor element 36 are coupled in series between the first power source 48 and the second downstream circuit 54. The sixth switching transistor element 34 and the eighth switching transistor element 38 are coupled in series between the second power source 50 and the second downstream circuit 54.

The first power source 48 provides a first power source output signal PS1 to both the first power source multiplexer 12 and the second power source multiplexer 14. The second power source 50 provides a second power source output signal PS2 to both the first power source multiplexer 12 and the second power source multiplexer 14. The first power source multiplexer 12 provides a first multiplexer output signal MUX1 to the first downstream circuit 52. The second power source multiplexer 14 provides a second multiplexer output signal MUX2 to the second downstream circuit 54.

In one embodiment of the first power source multiplexer 12, each of the first switching transistor element 16, the second switching transistor element 18, the third switching transistor element 20, and the fourth switching transistor element 22 is a P-type field effect transistor (PFET) transistor element, as shown. Further, in one embodiment of the first power source multiplexer 12, each of the first switching transistor element 16, the second switching transistor element 18, the third switching transistor element 20, and the fourth switching transistor element 22 is an enhancement mode field effect transistor element.

In one embodiment of the second power source multiplexer 14, each of the fifth switching transistor element 32, the sixth switching transistor element 34, the seventh switching transistor element 36, and the eighth switching transistor element 38 is a PFET transistor element, as shown. Further, in one embodiment of the second power source multiplexer 14, each of the fifth switching transistor element 32, the sixth switching transistor element 34, the seventh switching transistor element 36, and the eighth switching transistor element 38 is an enhancement mode field effect transistor element.

In this regard, in one embodiment of an enhancement mode PFET transistor element, the enhancement mode PFET transistor element is in an ON state when a gate voltage of the enhancement mode PFET transistor element is negative with respect to a source voltage of the enhancement mode PFET transistor element. Conversely, the enhancement mode PFET transistor element is in an OFF state when the gate voltage of the enhancement mode PFET transistor element is about equal to the source voltage of the enhancement mode PFET transistor element.

In one embodiment of the first power source 48, the first power source output signal PS1 provides a first output voltage having a first voltage magnitude. As such, the first power source 48 provides the first output voltage having the first voltage magnitude. Similarly, in one embodiment of the second power source 50, the second power source output signal PS2 provides a second output voltage having a second voltage magnitude. As such, the second power source 50 provides the second output voltage having the second voltage magnitude.

In one embodiment of the first power source multiplexer 12, the first power source multiplexer 12 receives and forwards a selected one of the first power source output signal PS1 and the second power source output signal PS2 to provide the first multiplexer output signal MUX1 to the first downstream circuit 52. Similarly, in one embodiment of the second power source multiplexer 14, the second power source multiplexer 14 receives and forwards a selected one of the first power source output signal PS1 and the second power source output signal PS2 to provide the second multiplexer output signal MUX2 to the second downstream circuit 54.

In order to properly forward the first power source output signal PS1 to the first downstream circuit 52, both the first switching transistor element 16 and the third switching transistor element 20 must be in the ON state, and either the second switching transistor element 18 or the fourth switching transistor element 22, or both, must be in the OFF state. Conversely, in order to properly forward the second power source output signal PS2 to the first downstream circuit 52, either the first switching transistor element 16 or the third switching transistor element 20, or both, must be in the OFF state, and both the second switching transistor element 18 and the fourth switching transistor element 22 must be in the ON state.

To provide the proper functionality as described above, a voltage swing at the first gate 24 is about equal to the first voltage magnitude, a voltage swing at the second gate 26 is about equal to the first voltage magnitude, a voltage swing at the third gate 28 is about equal to the second voltage magnitude, and a voltage swing at the fourth gate 30 is about equal to the second voltage magnitude. In general, when the first gate signal GS1 is presented to the first gate 24, the voltage swing at the first gate 24 is about equal to the first voltage magnitude. When the second gate signal GS2 is presented to the second gate 26, the voltage swing at the second gate 26 is about equal to the first voltage magnitude. When the third gate signal GS3 is presented to the third gate 28, the voltage swing at the third gate 28 is about equal to the second voltage magnitude. When the fourth gate signal GS4 is presented to the fourth gate 30, the voltage swing at the fourth gate 30 is about equal to the second voltage magnitude.

In order to properly forward the first power source output signal PS1 to the second downstream circuit 54, both the fifth switching transistor element 32 and the seventh switching transistor element 36 must be in the ON state, and either the sixth switching transistor element 34 or the eighth switching transistor element 38, or both, must be in the OFF state. Conversely, In order to properly forward the second power source output signal PS2 to the second downstream circuit 54, either the fifth switching transistor element 32 or the seventh switching transistor element 36, or both, must be in the OFF state, and both the sixth switching transistor element 34 and the eighth switching transistor element 38 must be in the ON state.

To provide the proper functionality as described above, a voltage swing at the fifth gate 40 is about equal to the first voltage magnitude, a voltage swing at the sixth gate 42 is about equal to the first voltage magnitude, a voltage swing at the seventh gate 44 is about equal to the second voltage magnitude, and a voltage swing at the eighth gate 46 is about equal to the second voltage magnitude. In general, when the fifth gate signal GS5 is presented to the fifth gate 40, the voltage swing at the fifth gate 40 is about equal to the first voltage magnitude. When the sixth gate signal GS6 is presented to the sixth gate 42, the voltage swing at the sixth gate 42 is about equal to the first voltage magnitude. When the seventh gate signal GS7 is presented to the seventh gate 44, the voltage swing at the seventh gate 44 is about equal to the second voltage magnitude. When the eighth gate signal GS8 is presented to the eighth gate 46, the voltage swing at the eighth gate 46 is about equal to the second voltage magnitude.

Detailed operation of the first power source multiplexer 12 under different operating conditions is presented. In a first embodiment of the circuitry 10, the first voltage magnitude is about equal to the second voltage magnitude and the first power source output signal PS1 is forwarded to the first downstream circuit 52. As such, both the first switching transistor element 16 and the third switching transistor element 20 must be in the ON state, and either the second switching transistor element 18 or the fourth switching transistor element 22, or both, must be in the OFF state. Both the first gate 24 and the third gate 28 are driven to about ground, thereby forcing both the first switching transistor element 16 and the third switching transistor element 20 into the ON state. The second gate 26 is driven to about the first voltage magnitude. However, since the first voltage magnitude is about equal to the second voltage magnitude, the second switching transistor element 18 is in the OFF state. The fourth gate 30 is driven to the second voltage magnitude, thereby forcing the fourth switching transistor element 22 into the OFF state.

In a second embodiment of the circuitry 10, the first voltage magnitude is about equal to the second voltage magnitude and the second power source output signal PS2 is forwarded to the first downstream circuit 52. As such, either the first switching transistor element 16 or the third switching transistor element 20, or both, must be in the OFF state, and both the second switching transistor element 18 and the fourth switching transistor element 22 must be in the ON state. Both the second gate 26 and the fourth gate 30 are driven to about ground, thereby forcing both the second switching transistor element 18 and the fourth switching transistor element 22 into the ON state. The first gate 24 is driven to about the first voltage magnitude, thereby forcing the first switching transistor element 16 into the OFF state. The third gate 28 is driven to about the second voltage magnitude. However, since the first voltage magnitude is about equal to the second voltage magnitude, the third switching transistor element 20 is in the OFF state.

In one embodiment of the circuitry 10, the first voltage magnitude is not equal to the second voltage magnitude. As such, in a third embodiment of the circuitry 10, the first voltage magnitude is greater than the second voltage magnitude and the first power source output signal PS1 is forwarded to the first downstream circuit 52. As such, both the first switching transistor element 16 and the third switching transistor element 20 must be in the ON state, and either the second switching transistor element 18 or the fourth switching transistor element 22, or both, must be in the OFF state. Both the first gate 24 and the third gate 28 are driven to about ground, thereby forcing both the first switching transistor element 16 and the third switching transistor element 20 into the ON state. The second gate 26 is driven to about the first voltage magnitude. However, since the first voltage magnitude is greater than the second voltage magnitude, the second switching transistor element 18 is in the OFF state. The fourth gate 30 is driven to the second voltage magnitude, thereby forcing the fourth switching transistor element 22 into the OFF state.

In a fourth embodiment of the circuitry 10, the first voltage magnitude is greater than the second voltage magnitude and the second power source output signal PS2 is forwarded to the first downstream circuit 52. As such, either the first switching transistor element 16 or the third switching transistor element 20, or both, must be in the OFF state, and both the second switching transistor element 18 and the fourth switching transistor element 22 must be in the ON state. Both the second gate 26 and the fourth gate 30 are driven to about ground, thereby forcing both the second switching transistor element 18 and the fourth switching transistor element 22 into the ON state. The first gate 24 is driven to about the first voltage magnitude, thereby forcing the first switching transistor element 16 into the OFF state. The third gate 28 is driven to about the second voltage magnitude. However, since the first voltage magnitude is greater than the second voltage magnitude, the third switching transistor element 20 may not be in the OFF state. Therefore, the first switching transistor element 16 isolates the first power source 48 from the first downstream circuit 52.

In a fifth embodiment of the circuitry 10, the first voltage magnitude is less than the second voltage magnitude and the first power source output signal PS1 is forwarded to the first downstream circuit 52. As such, both the first switching transistor element 16 and the third switching transistor element 20 must be in the ON state, and either the second switching transistor element 18 or the fourth switching transistor element 22, or both, must be in the OFF state. Both the first gate 24 and the third gate 28 are driven to about ground, thereby forcing both the first switching transistor element 16 and the third switching transistor element 20 into the ON state. The second gate 26 is driven to about the first voltage magnitude. However, since the first voltage magnitude is less than the second voltage magnitude, the second switching transistor element 18 may not be in the OFF state. The fourth gate 30 is driven to the second voltage magnitude, thereby forcing the fourth switching transistor element 22 into the OFF state. Therefore, the fourth switching transistor element 22 isolates the second power source 50 from the first downstream circuit 52.

In a sixth embodiment of the circuitry 10, the first voltage magnitude is less than the second voltage magnitude and the second power source output signal PS2 is forwarded to the first downstream circuit 52. As such, either the first switching transistor element 16 or the third switching transistor element 20, or both, must be in the OFF state, and both the second switching transistor element 18 and the fourth switching transistor element 22 must be in the ON state. Both the second gate 26 and the fourth gate 30 are driven to about ground, thereby forcing both the second switching transistor element 18 and the fourth switching transistor element 22 into the ON state. The first gate 24 is driven to about the first voltage magnitude, thereby forcing the first switching transistor element 16 into the OFF state. The third gate 28 is driven to about the second voltage magnitude. However, since the first voltage magnitude is less than the second voltage magnitude, the third switching transistor element 20 is in the OFF state.

Figure 2:
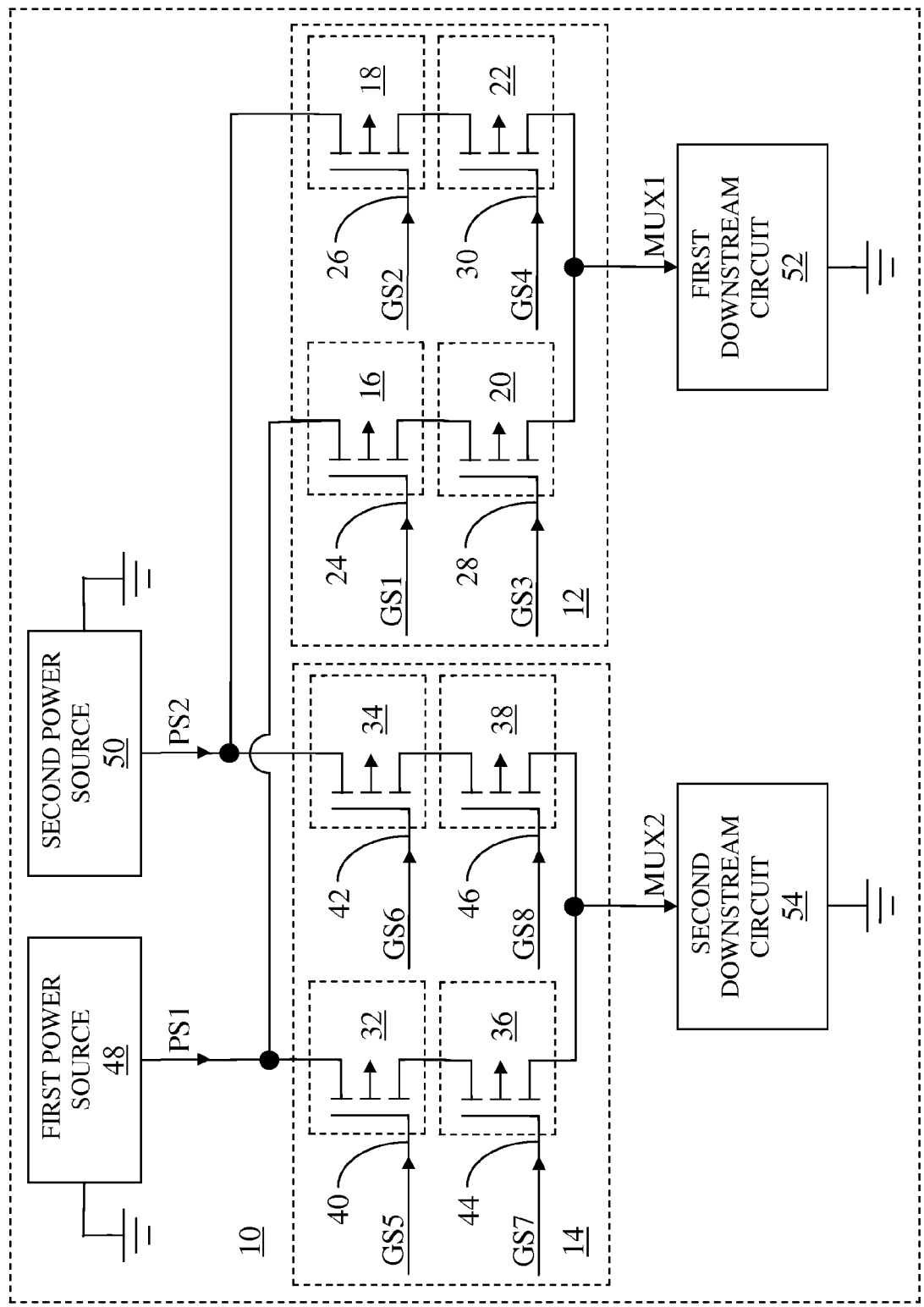
FIG. 2 shows the circuitry according to an alternate embodiment of the circuitry.

FIG. 2 shows the circuitry 10 according to an alternate embodiment of the circuitry 10. The circuitry 10 illustrated in FIG. 2 is similar to the circuitry 10 illustrated in FIG. 1, except the circuitry 10 illustrated in FIG. 2 further includes the first power source 48, the second power source 50, the first downstream circuit 52, and the second downstream circuit 54. In a first exemplary embodiment of the circuitry 10, the first power source 48 is provided external to the circuitry 10. In a second exemplary embodiment of the circuitry 10, the second power source 50 is provided external to the circuitry 10. In a third exemplary embodiment of the circuitry 10, the first downstream circuit 52 is provided external to the circuitry 10. In a fourth exemplary embodiment of the circuitry 10, the second downstream circuit 54 is provided external to the circuitry 10. In a fifth exemplary embodiment of the circuitry 10, any or all of the first power source 48, the second power source 50, the first downstream circuit 52, and the second downstream circuit 54 are provided external to the circuitry 10.

In one embodiment of the first power source 48, the first power source 48 is a battery. In one embodiment of the second power source 50, the second power source 50 is a DC-DC converter. In one embodiment of the DC-DC converter, the DC-DC converter uses charge pump based DC-DC conversion. In an alternate embodiment of the DC-DC converter, the DC-DC converter uses inductor based DC-DC conversion. In an additional embodiment of the DC-DC converter, the DC-DC converter uses both charge pump based DC-DC conversion and inductor based DC-DC conversion.

In an alternate embodiment of the first power source 48, the first power source 48 is a supplemental DC-DC converter. In one embodiment of the supplemental DC-DC converter, the supplemental DC-DC converter uses charge pump based DC-DC conversion. In an alternate embodiment of the supplemental DC-DC converter, the supplemental DC-DC converter uses inductor based DC-DC conversion. In an additional embodiment of the supplemental DC-DC converter, the supplemental DC-DC converter uses both charge pump based DC-DC conversion and inductor based DC-DC conversion.

In another embodiment of the circuitry 10, the second power source multiplexer 14 and the second downstream circuit 54 are both omitted. As such, the fifth switching transistor element 32, the sixth switching transistor element 34, the seventh switching transistor element 36, and the eighth switching transistor element 38 are omitted.

Figure 3:
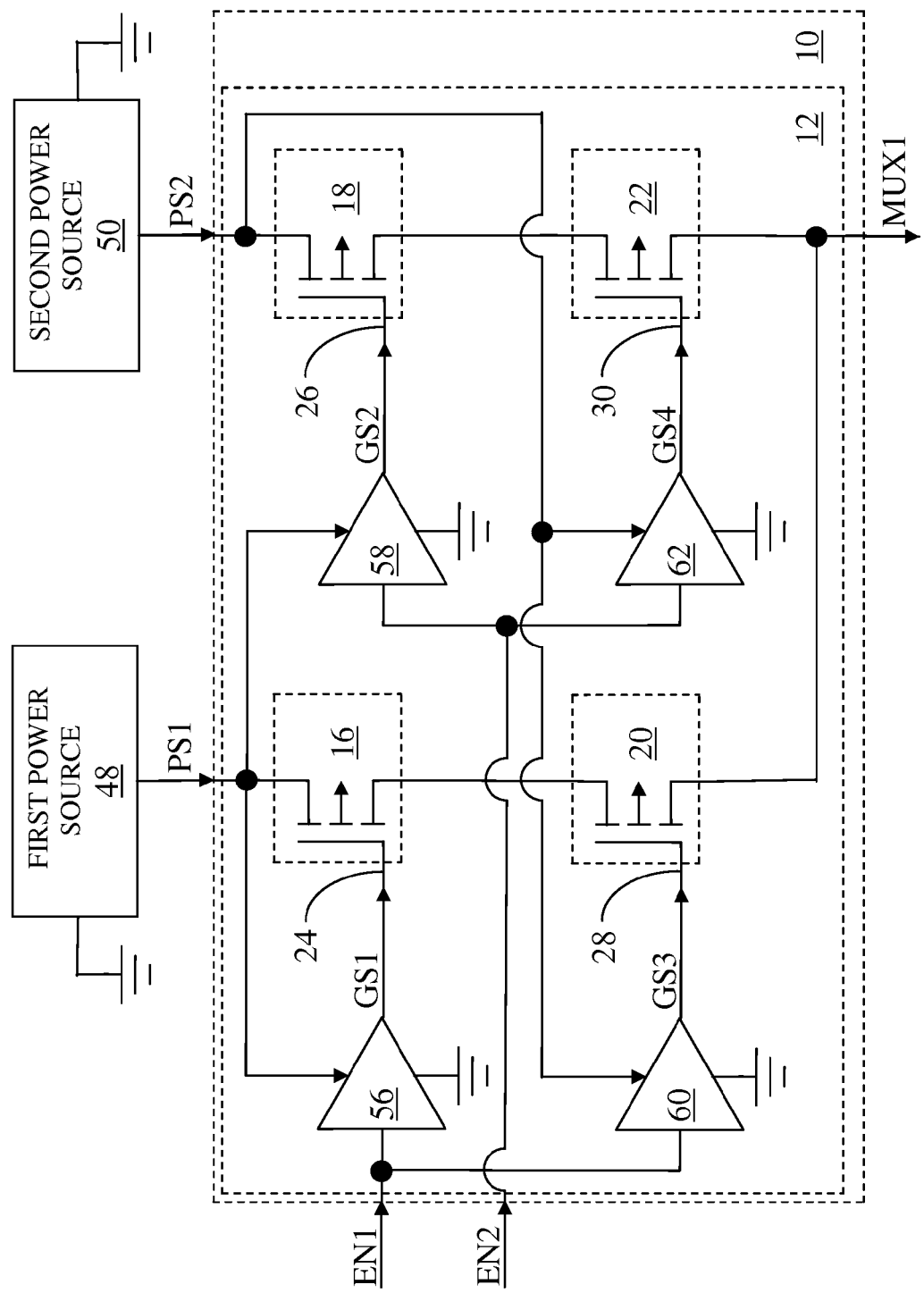
FIG. 3 shows details of a first power source multiplexer illustrated in FIG. 1 according to an alternate embodiment of the first power source multiplexer.

FIG. 3 shows details of the first power source multiplexer 12 illustrated in FIG. 1 according to an alternate embodiment of the first power source multiplexer 12. The first power source multiplexer 12 illustrated in FIG. 3 is similar to the first power source multiplexer 12 illustrated in FIG. 1, except the first power source multiplexer 12 illustrated in FIG. 3 further includes a first gate driver 56, a second gate driver 58, a third gate driver 60, and a fourth gate driver 62.

The first gate driver 56 is coupled to the first gate 24. The second gate driver 58 is coupled to the second gate 26. The third gate driver 60 is coupled to the third gate 28. The fourth gate driver 62 is coupled to the fourth gate 30. The first gate driver 56 and the third gate driver 60 receive a first enable signal EN1. The second gate driver 58 and the fourth gate driver 62 receive a second enable signal EN2. Additionally, the first gate driver 56 and the second gate driver 58 receive the first power source output signal PS1. The third gate driver 60 and the fourth gate driver 62 receive the second power source output signal PS2. A voltage swing of the first enable signal EN1 is about equal to a logic level voltage swing. Similarly, a voltage swing of the second enable signal EN2 is about equal to the logic level voltage swing.

The first gate driver 56 provides the first gate signal GS1 to the first gate 24 based on the first enable signal EN1 and the first power source output signal PS1. Specifically, in one embodiment of the first gate driver 56, a logic level of the first gate signal GS1 is based on a logic level of the first enable signal EN1. In one embodiment of the first power source 48, the first power source output signal PS1 provides the first output voltage having the first voltage magnitude. As such, a voltage swing of the first gate signal GS1 is about equal to the first voltage magnitude. Therefore, the voltage swing at the first gate 24 is about equal to the first voltage magnitude. In one embodiment of the first gate driver 56, a voltage swing of the first enable signal EN1 is not equal to the voltage swing of the first gate signal GS1. Therefore, the first gate driver 56 provides appropriate level translation to the first enable signal EN1 for proper operation. In a first embodiment of the first gate driver 56, the first gate driver 56 applies a logic inversion to the first enable signal EN1 to provide the first gate signal GS1. In a second embodiment of the first gate driver 56, the first gate driver 56 does not apply a logic inversion to the first enable signal EN1 to provide the first gate signal GS1.

The second gate driver 58 provides the second gate signal GS2 to the second gate 26 based on the second enable signal EN2 and the first power source output signal PS1. Specifically, in one embodiment of the second gate driver 58, a logic level of the second gate signal GS2 is based on the logic level of the second enable signal EN2. In one embodiment of the first power source 48, the first power source output signal PS1 provides the first output voltage having the first voltage magnitude. As such, a voltage swing of the second gate signal GS2 is about equal to the first voltage magnitude. Therefore, the voltage swing at the second gate 26 is about equal to the first voltage magnitude. In one embodiment of the second gate driver 58, a voltage swing of the second enable signal EN2 is not equal to the voltage swing of the second gate signal GS2. Therefore, the second gate driver 58 provides appropriate level translation to the second enable signal EN2 for proper operation. In a first embodiment of the second gate driver 58, the second gate driver 58 applies a logic inversion to the second enable signal EN2 to provide the second gate signal GS2. In a second embodiment of the second gate driver 58, the second gate driver 58 does not apply a logic inversion to the second enable signal EN2 to provide the second gate signal GS2.

The third gate driver 60 provides the third gate signal GS3 to the third gate 28 based on the first enable signal EN1 and the second power source output signal PS2. Specifically, in one embodiment of the third gate driver 60, a logic level of the third gate signal GS3 is based on a logic level of the first enable signal EN1. In one embodiment of the second power source 50, the second power source output signal PS2 provides the second output voltage having the second voltage magnitude. As such, a voltage swing of the third gate signal GS3 is about equal to the second voltage magnitude. Therefore, the voltage swing at the third gate 28 is about equal to the second voltage magnitude. In one embodiment of the third gate driver 60, a voltage swing of the first enable signal EN1 is not equal to the voltage swing of the third gate signal GS3. Therefore, the third gate driver 60 provides appropriate level translation to the first enable signal EN1 for proper operation. In a first embodiment of the third gate driver 60, the third gate driver 60 applies a logic inversion to the first enable signal EN1 to provide the third gate signal GS3. In a second embodiment of the third gate driver 60, the third gate driver 60 does not apply a logic inversion to the first enable signal EN1 to provide the third gate signal GS3.

The fourth gate driver 62 provides the fourth gate signal GS4 to the fourth gate 30 based on the second enable signal EN2 and the second power source output signal PS2. Specifically, in one embodiment of the fourth gate driver 62, a logic level of the fourth gate signal GS4 is based on the logic level of the second enable signal EN2. In one embodiment of the second power source 50, the second power source output signal PS2 provides the second output voltage having the second voltage magnitude. As such, a voltage swing of the fourth gate signal GS4 is about equal to the second voltage magnitude. Therefore, the voltage swing at the fourth gate 30 is about equal to the second voltage magnitude. In one embodiment of the fourth gate driver 62, a voltage swing of the second enable signal EN2 is not equal to the voltage swing of the fourth gate signal GS4. Therefore, the fourth gate driver 62 provides appropriate level translation to the second enable signal EN2 for proper operation. In a first embodiment of the fourth gate driver 62, the fourth gate driver 62 applies a logic inversion to the second enable signal EN2 to provide the fourth gate signal GS4. In a second embodiment of the fourth gate driver 62, the fourth gate driver 62 does not apply a logic inversion to the second enable signal EN2 to provide the fourth gate signal GS4.

Figure 4:
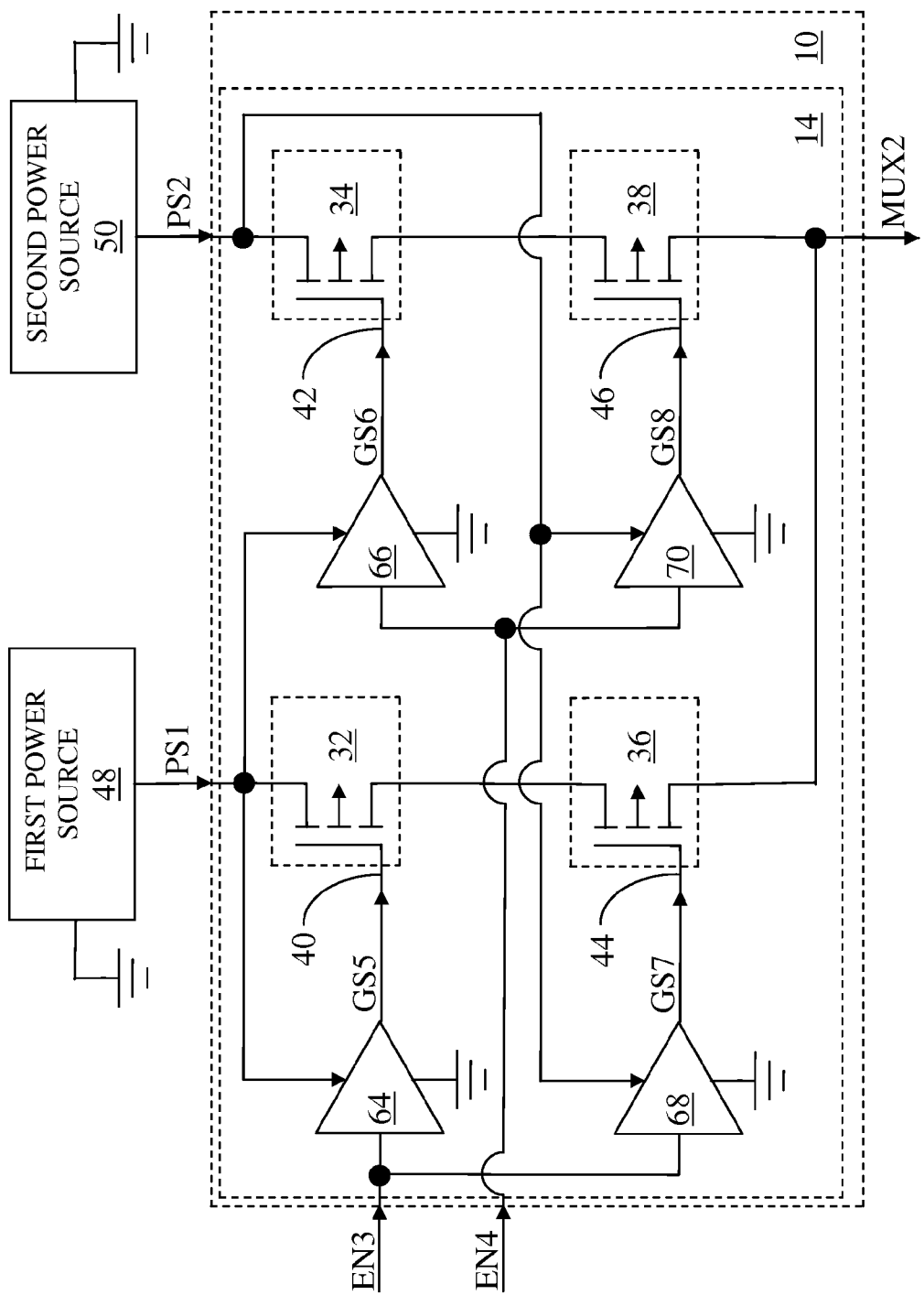
FIG. 4 shows details of a second power source multiplexer illustrated in FIG. 1 according to an alternate embodiment of the second power source multiplexer.

FIG. 4 shows details of the second power source multiplexer 14 illustrated in FIG. 1 according to an alternate embodiment of the second power source multiplexer 14. The second power source multiplexer 14 illustrated in FIG. 4 is similar to the second power source multiplexer 14 illustrated in FIG. 1, except the second power source multiplexer 14 illustrated in FIG. 4 further includes a fifth gate driver 64, a sixth gate driver 66, a seventh gate driver 68, and an eighth gate driver 70.

The fifth gate driver 64 is coupled to the fifth gate 40. The sixth gate driver 66 is coupled to the sixth gate 42. The seventh gate driver 68 is coupled to the seventh gate 44. The eighth gate driver 70 is coupled to the eighth gate 46. The fifth gate driver 64 and the seventh gate driver 68 receive a third enable signal EN3. The sixth gate driver 66 and the eighth gate driver 70 receive a fourth enable signal EN4. Additionally, the fifth gate driver 64 and the sixth gate driver 66 receive the first power source output signal PS1. The seventh gate driver 68 and the eighth gate driver 70 receive the second power source output signal PS2. A voltage swing of the third enable signal EN3 is about equal to a logic level voltage swing. Similarly, a voltage swing of the fourth enable signal EN4 is about equal to the logic level voltage swing.

The fifth gate driver 64 provides the fifth gate signal GS5 to the fifth gate 40 based on the third enable signal EN3 and the first power source output signal PS1. Specifically, in one embodiment of the fifth gate driver 64, a logic level of the fifth gate signal GS5 is based on a logic level of the third enable signal EN3. In one embodiment of the first power source 48, the first power source output signal PS1 provides the first output voltage having the first voltage magnitude. As such, a voltage swing of the fifth gate signal GS5 is about equal to the first voltage magnitude. Therefore, the voltage swing at the fifth gate 40 is about equal to the first voltage magnitude. In one embodiment of the fifth gate driver 64, a voltage swing of the third enable signal EN3 is not equal to the voltage swing of the fifth gate signal GS5. Therefore, the fifth gate driver 64 provides appropriate level translation to the third enable signal EN3 for proper operation. In a first embodiment of the fifth gate driver 64, the fifth gate driver 64 applies a logic inversion to the third enable signal EN3 to provide the fifth gate signal GS5. In a second embodiment of the fifth gate driver 64, the fifth gate driver 64 does not apply a logic inversion to the third enable signal EN3 to provide the fifth gate signal GS5.

The sixth gate driver 66 provides the sixth gate signal GS6 to the sixth gate 42 based on the fourth enable signal EN4 and the first power source output signal PS1. Specifically, in one embodiment of the sixth gate driver 66, a logic level of the sixth gate signal GS6 is based on the logic level of the fourth enable signal EN4. In one embodiment of the first power source 48, the first power source output signal PS1 provides the first output voltage having the first voltage magnitude. As such, a voltage swing of the sixth gate signal GS6 is about equal to the first voltage magnitude. Therefore, the voltage swing at the sixth gate 42 is about equal to the first voltage magnitude. In one embodiment of the sixth gate driver 66, a voltage swing of the fourth enable signal EN4 is not equal to the voltage swing of the sixth gate signal GS6. Therefore, the sixth gate driver 66 provides appropriate level translation to the fourth enable signal EN4 for proper operation. In a first embodiment of the sixth gate driver 66, the sixth gate driver 66 applies a logic inversion to the fourth enable signal EN4 to provide the sixth gate signal GS6. In a second embodiment of the sixth gate driver 66, the sixth gate driver 66 does not apply a logic inversion to the fourth enable signal EN4 to provide the sixth gate signal GS6.

The seventh gate driver 68 provides the seventh gate signal GS7 to the seventh gate 44 based on the third enable signal EN3 and the second power source output signal PS2. Specifically, in one embodiment of the seventh gate driver 68, a logic level of the seventh gate signal GS7 is based on a logic level of the third enable signal EN3. In one embodiment of the second power source 50, the second power source output signal PS2 provides the second output voltage having the second voltage magnitude. As such, a voltage swing of the seventh gate signal GS7 is about equal to the second voltage magnitude. Therefore, the voltage swing at the seventh gate 44 is about equal to the second voltage magnitude. In one embodiment of the seventh gate driver 68, a voltage swing of the third enable signal EN3 is not equal to the voltage swing of the seventh gate signal GS7. Therefore, the seventh gate driver 68 provides appropriate level translation to the third enable signal EN3 for proper operation. In a first embodiment of the seventh gate driver 68, the seventh gate driver 68 applies a logic inversion to the third enable signal EN3 to provide the seventh gate signal GS7. In a second embodiment of the seventh gate driver 68, the seventh gate driver 68 does not apply a logic inversion to the third enable signal EN3 to provide the seventh gate signal GS7.

The eighth gate driver 70 provides the eighth gate signal GS8 to the eighth gate 46 based on the fourth enable signal EN4 and the second power source output signal PS2. Specifically, in one embodiment of the eighth gate driver 70, a logic level of the eighth gate signal GS8 is based on the logic level of the fourth enable signal EN4. In one embodiment of the second power source 50, the second power source output signal PS2 provides the second output voltage having the second voltage magnitude. As such, a voltage swing of the eighth gate signal GS8 is about equal to the second voltage magnitude. Therefore, the voltage swing at the eighth gate 46 is about equal to the second voltage magnitude. In one embodiment of the eighth gate driver 70, a voltage swing of the fourth enable signal EN4 is not equal to the voltage swing of the eighth gate signal GS8. Therefore, the eighth gate driver 70 provides appropriate level translation to the fourth enable signal EN4 for proper operation. In a first embodiment of the eighth gate driver 70, the eighth gate driver 70 applies a logic inversion to the fourth enable signal EN4 to provide the eighth gate signal GS8. In a second embodiment of the eighth gate driver 70, the eighth gate driver 70 does not apply a logic inversion to the fourth enable signal EN4 to provide the eighth gate signal GS8.

Figure 5:
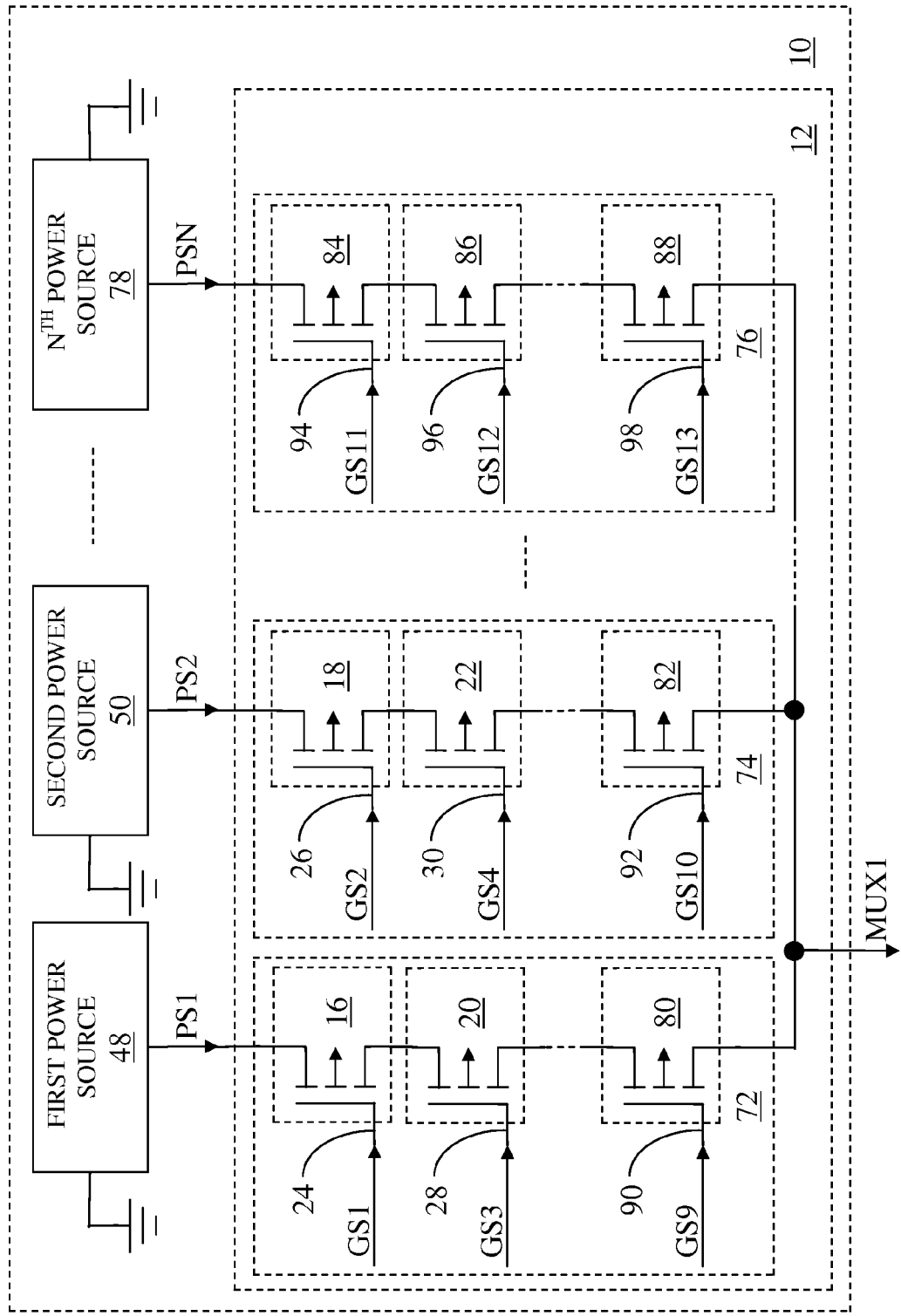
FIG. 5 shows details of the first power source multiplexer illustrated in FIG. 1 according to an additional embodiment of the first power source multiplexer.

FIG. 5 shows details of the circuitry 10 according to one embodiment of the circuitry 10. The circuitry 10 illustrated in FIG. 5 is similar to the circuitry 10 illustrated in FIG. 2, except in the circuitry 10 illustrated in FIG. 5, the first power source multiplexer 12 further includes a first series coupling 72, a second series coupling 74, and up to and including an $N^{TH}$ series coupling 76. In general, the first power source multiplexer 12 includes a group of series couplings 72, 74, 76. Additionally, the circuitry 10 illustrated in FIG. 5 includes the first power source 48, the second power source 50, and up to and including an $N^{TH}$ power source 78. In general, the circuitry 10 illustrated in FIG. 5 includes a group of power sources 48, 50, 78.

The first series coupling 72 includes the first switching transistor element 16, the third switching transistor element 20, and up to and including an $N^{TH}$ first coupling switching transistor element 80. In general, the first series coupling 72 includes a first group of switching transistor elements 16, 20, 80. The second series coupling 74 includes the second switching transistor element 18, the fourth switching transistor element 22, and up to and including an $N^{TH}$ second coupling switching transistor element 82. In general, the second series coupling 74 includes a second group of switching transistor elements 18, 22, 82. The $N^{TH}$ series coupling 76 includes a first $N^{TH}$ coupling switching transistor element 84, a second $N^{TH}$ coupling switching transistor element 86, and up to and including an $N^{TH}$ $N^{TH}$ coupling switching transistor element 88. In general, the $N^{TH}$ series coupling 76 includes an $N^{TH}$ group of switching transistor elements 84, 86, 88.

All of the first group of switching transistor elements 16, 20, 80 are coupled in series between the first power source 48 and the first downstream circuit 52 (FIG. 2). All of the second group of switching transistor elements 18, 22, 82 are coupled between the second power source 50 and the first downstream circuit 52 (FIG. 2). All of the $N^{TH}$ group of switching transistor elements 84, 86, 88 are coupled between the $N^{TH}$ power source 78 and the first downstream circuit 52 (FIG. 2). In general, each of the group of series couplings 72, 74, 76 includes a corresponding group of switching transistor elements coupled in series between a corresponding one of the group of power sources 48, 50, 78 and the first downstream circuit 52 (FIG. 2).

The $N^{TH}$ first coupling switching transistor element 80 has a ninth gate 90. The ninth gate 90 receives a ninth gate signal GS9. The $N^{TH}$ second coupling switching transistor element 82 has a tenth gate 92. The tenth gate 92 receives a tenth gate signal GS10. The first $N^{TH}$ coupling switching transistor element 84 has an eleventh gate 94. The eleventh gate 94 receives an eleventh gate signal GS11. The second $N^{TH}$ coupling switching transistor element 86 has a twelfth gate 96. The twelfth gate 96 receives a twelfth gate signal GS12. The $N^{TH}$ $N^{TH}$ coupling switching transistor element 88 has a thirteenth gate 98. The thirteenth gate 98 receives a thirteenth gate signal GS13.

The first power source 48 provides the first power source output signal PS1 to the first series coupling 72. The first power source output signal PS1 has the first voltage magnitude. In one embodiment of the first series coupling 72, the first power source 48 provides the first power source output signal PS1 to the first switching transistor element 16. The second power source 50 provides the second power source output signal PS2 to the second series coupling 74. The second power source output signal PS2 has the second voltage magnitude. In one embodiment of the second series coupling 74, the second power source 50 provides the second power source output signal PS2 to the second switching transistor element 18. The $N^{TH}$ power source 78 provides an $N^{TH}$ power source output signal PSN to the $N^{TH}$ series coupling 76. The $N^{TH}$ power source output signal PSN has an $N^{TH}$ voltage magnitude. In one embodiment of the $N^{TH}$ series coupling 76, the $N^{TH}$ power source 78 provides the $N^{TH}$ power source output signal PSN to the first $N^{TH}$ coupling switching transistor element 84. In general, the group of power sources 48, 50, 78 provides a group of power source output signals PS1, PS2, PSN to the group of series couplings 72, 74, 76. Each of the group of power source output signals PS1, PS2, PSN has a corresponding one of a group of voltage magnitudes.

Figure 6:
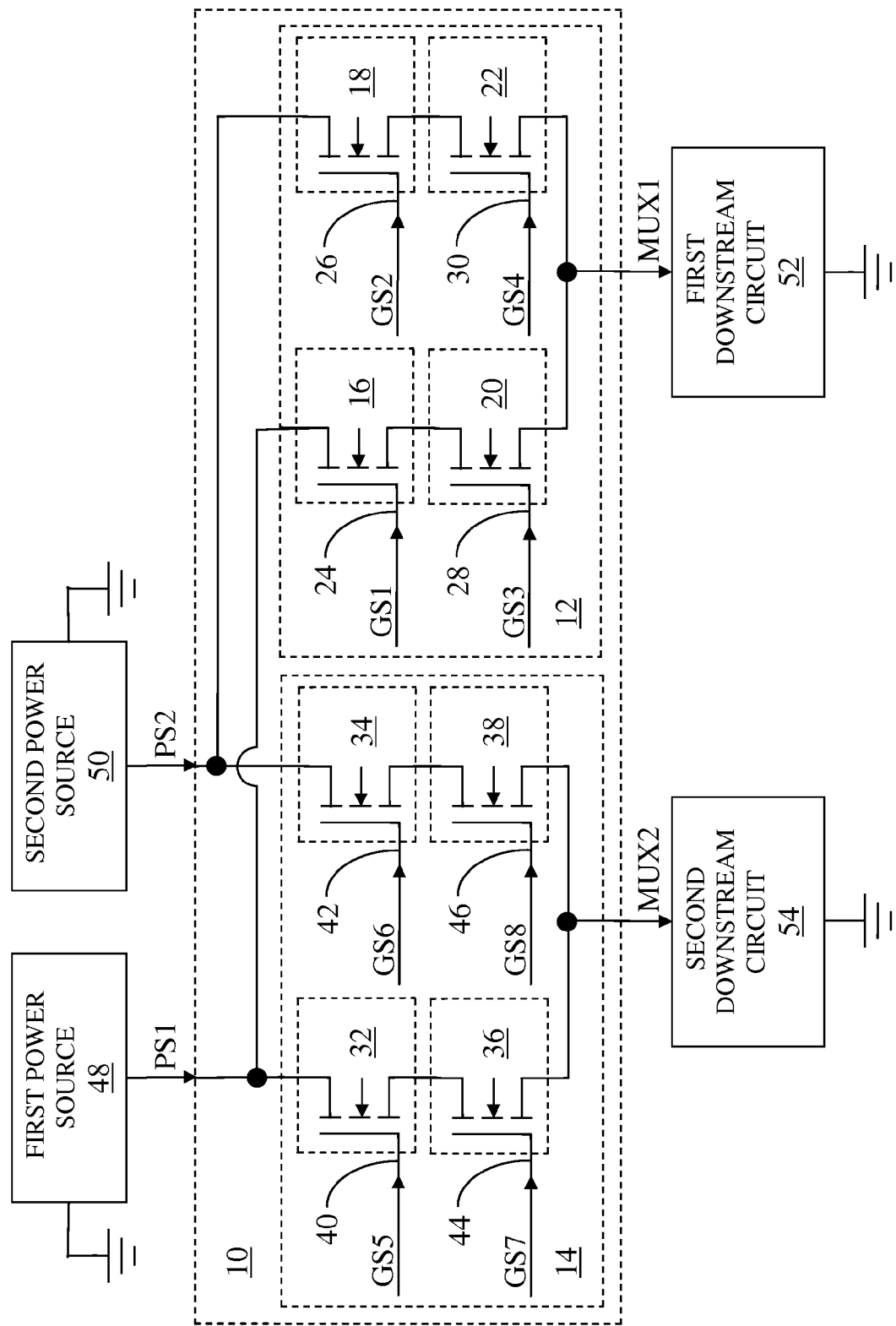
FIG. 6 shows details of the first power source multiplexer and the second power source multiplexer illustrated in FIG. 1 according to another embodiment of the first power source multiplexer and the second power source multiplexer.

FIG. 6 shows details of the first power source multiplexer 12 and the second power source multiplexer 14 illustrated in FIG. 1 according to another embodiment of the first power source multiplexer 12 and the second power source multiplexer 14. The first power source multiplexer 12 and the second power source multiplexer 14 illustrated in FIG. 6 are similar to the first power source multiplexer 12 and the second power source multiplexer 14 illustrated in FIG. 1, except in the first power source multiplexer 12 and the second power source multiplexer 14 illustrated in FIG. 6, each of the first switching transistor element 16, the second switching transistor element 18, the third switching transistor element 20, the fourth switching transistor element 22, the fifth switching transistor element 32, the sixth switching transistor element 34, the seventh switching transistor element 36, and the eighth switching transistor element 38 is an N-type field effect transistor (NFET) transistor element, as shown.

One potential shortcoming of the circuitry 10 illustrated in FIG. 1 is that to provide the first multiplexer output signal MUX1 (FIG. 1) or the second multiplexer output signal MUX2 (FIG. 1), the first power source output signal PS1 (FIG. 1) or the second power source output signal PS2 (FIG. 1) must be forwarded through two switching transistor elements coupled in series. For example, the first switching transistor element 16 (FIG. 1) and the third switching transistor element 20 (FIG. 1) are coupled in series between the first power source 48 (FIG. 1) and the first downstream circuit 52 (FIG. 1). A voltage drop across the first switching transistor element 16 (FIG. 1) and the third switching transistor element 20 (FIG. 1) may be problematic in some applications, particularly if the first switching transistor element 16 (FIG. 1) and the third switching transistor element 20 (FIG. 1) are power transistor elements. As such, an embodiment of the circuitry 10 that eliminates one of the voltage drops is presented.

Figure 7:
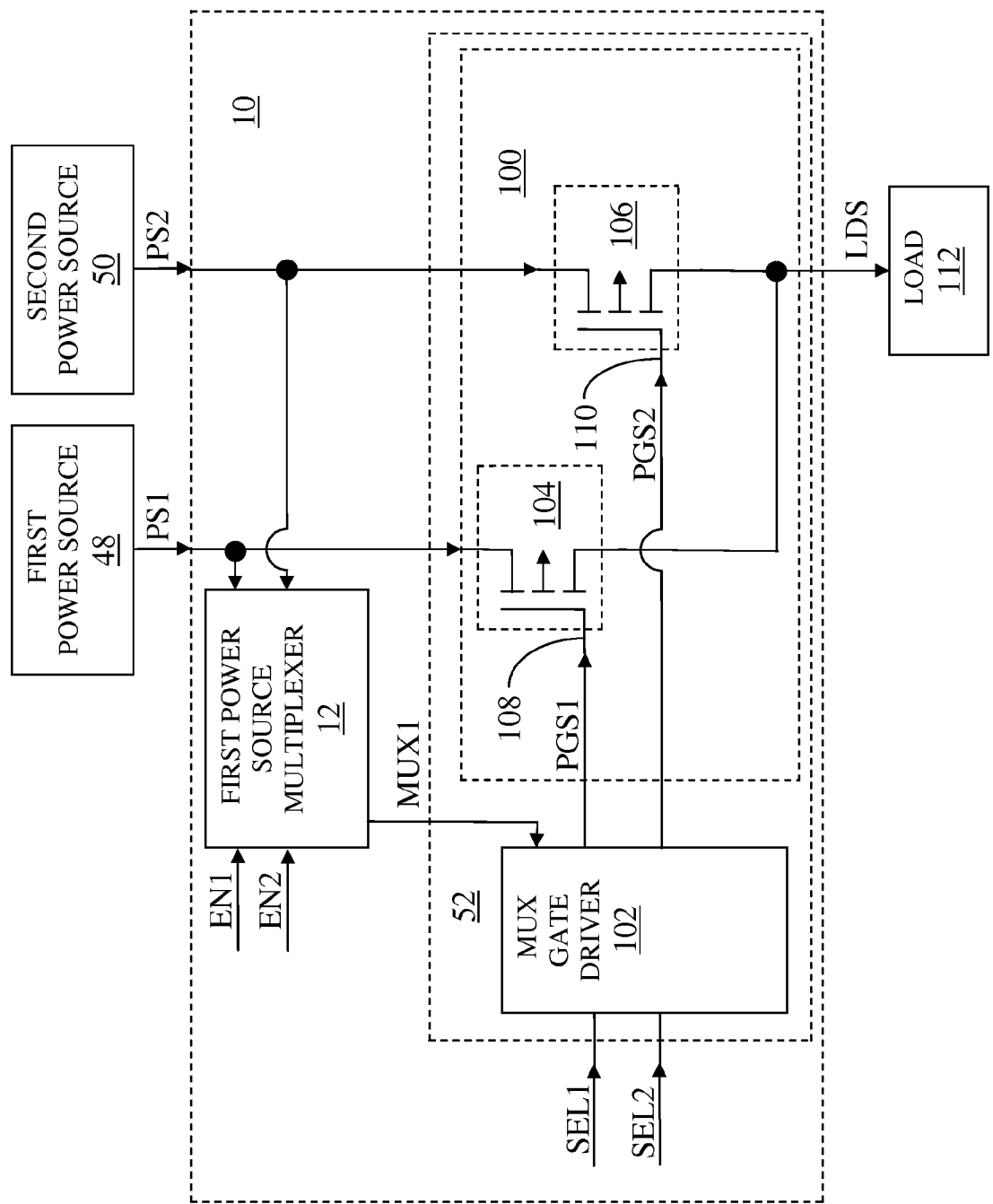
FIG. 7 shows the circuitry according to an additional embodiment of the circuitry.

FIG. 7 shows the circuitry 10 according to an additional embodiment of the circuitry 10. The circuitry 10 illustrated in FIG. 7 is similar to the circuitry 10 illustrated in FIG. 3, except in the circuitry 10 illustrated in FIG. 7, the first downstream circuit 52 includes a power transistor-based multiplexer 100 and a multiplexer gate driver 102. The power transistor-based multiplexer 100 includes a first power transistor element 104 and a second power transistor element 106. The first power transistor element 104 has a first power transistor gate 108 and the second power transistor element 106 has a second power transistor gate 110. The multiplexer gate driver 102 provides a first power gate signal PGS1 to the first power transistor gate 108. Further, the multiplexer gate driver 102 provides a second power gate signal PGS2 to the second power transistor gate 110.

The first power transistor element 104 is coupled between the first power source 48 and a load 112. The second power transistor element 106 is coupled between the second power source 50 and the load 112. A voltage swing at the first power transistor gate 108 is about equal to a maximum voltage magnitude. A voltage swing at the second power transistor gate 110 is about equal to the maximum voltage magnitude. In general, when the first power gate signal PGS1 is presented to the first power transistor gate 108, the voltage swing at the first power transistor gate 108 is about equal to the maximum voltage magnitude. Also, when the second power gate signal PGS2 is presented to the second power transistor gate 110, the voltage swing at the second power transistor gate 110 is about equal to the maximum voltage magnitude. The maximum voltage magnitude is about equal to either the first voltage magnitude or the second voltage magnitude. If the first voltage magnitude is greater than the second voltage magnitude, then the maximum voltage magnitude is about equal to the first voltage magnitude. If the second voltage magnitude is greater than the first voltage magnitude, then the maximum voltage magnitude is about equal to the second voltage magnitude. If the first voltage magnitude is equal to the second voltage magnitude, then the maximum voltage magnitude is about equal to either the first voltage magnitude or the second voltage magnitude.

The first power source multiplexer 12 selects the maximum voltage magnitude based on the first enable signal EN1 and the second enable signal EN2. As such, the first multiplexer output signal MUX1 has the maximum voltage magnitude. The multiplexer gate driver 102 receives and forwards the first multiplexer output signal MUX1 to a selected one of the first power transistor element 104 and the second power transistor element 106. Specifically, the multiplexer gate driver 102 receives and forwards the first multiplexer output signal MUX1 to either the first power transistor gate 108 or the second power transistor gate 110. Conversely, the multiplexer gate driver 102 forwards a less than maximum voltage magnitude to an unselected one of the first power transistor element 104 and the second power transistor element 106. In one embodiment of the less than maximum voltage magnitude, the less than maximum voltage magnitude is equal to about ground.

By forwarding the maximum voltage magnitude to the first power transistor gate 108, the first power transistor element 104 is forced into an OFF state. By forwarding the maximum voltage magnitude to the second power transistor gate 110, the second power transistor element 106 is forced into the OFF state. By forwarding the less than maximum voltage magnitude to the first power transistor gate 108, the first power transistor element 104 is forced into an ON state. By forwarding the less than maximum voltage magnitude to the second power transistor gate 110, the second power transistor element 106 is forced into the ON state.

The multiplexer gate driver 102 receives a first select signal SEL1 and a second select signal SEL2. The multiplexer gate driver 102 selects the selected one of the first power transistor element 104 and the second power transistor element 106 based on the first select signal SEL1 and the second select signal SEL2. Further, the multiplexer gate driver 102 determines the unselected one of the first power transistor element 104 and the second power transistor element 106 based on the first select signal SEL1 and the second select signal SEL2.

When the unselected one of the first power transistor element 104 and the second power transistor element 106 is the first power transistor element 104, the first power transistor element 104 is in the ON state, thereby forwarding the first power source output signal PS1 to provide a load signal LDS to the load 112. Conversely, when the unselected one of the first power transistor element 104 and the second power transistor element 106 is the second power transistor element 106, the second power transistor element 106 is in the ON state, thereby forwarding the second power source output signal PS2 to provide the load signal LDS to the load 112.

Figure 8:
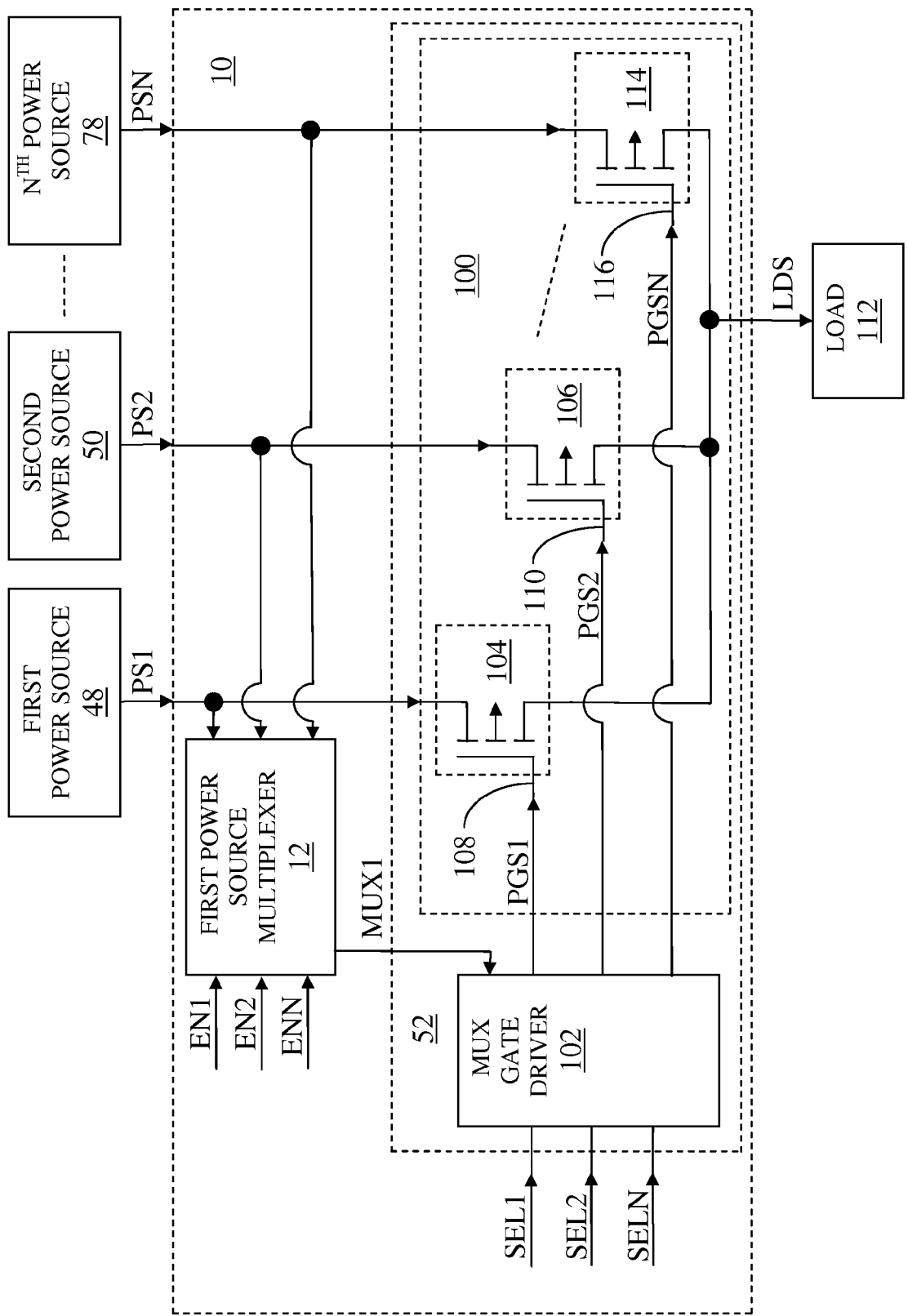
FIG. 8 shows the circuitry according to another embodiment of the circuitry.

FIG. 8 shows the circuitry 10 according to another embodiment of the circuitry 10. The circuitry 10 illustrated in FIG. 8 is similar to the circuitry 10 illustrated in FIG. 7, except in the circuitry 10 illustrated in FIG. 8, the first power source multiplexer 12 receives the first enable signal EN1, the second enable signal EN2, and up to and including an $N^{TH}$ enable signal ENN. The multiplexer gate driver 102 receives the first select signal SEL1, the second select signal SEL2, and up to and including an $N^{TH}$ select signal SELN. The power transistor-based multiplexer 100 includes the first power transistor element 104, the second power transistor element 106, and up to and including an $N^{TH}$ power transistor element 114. The $N^{TH}$ power transistor element 114 has an $N^{TH}$ power transistor gate 116, which receives an $N^{TH}$ power gate signal PGSN.

Figure 9:
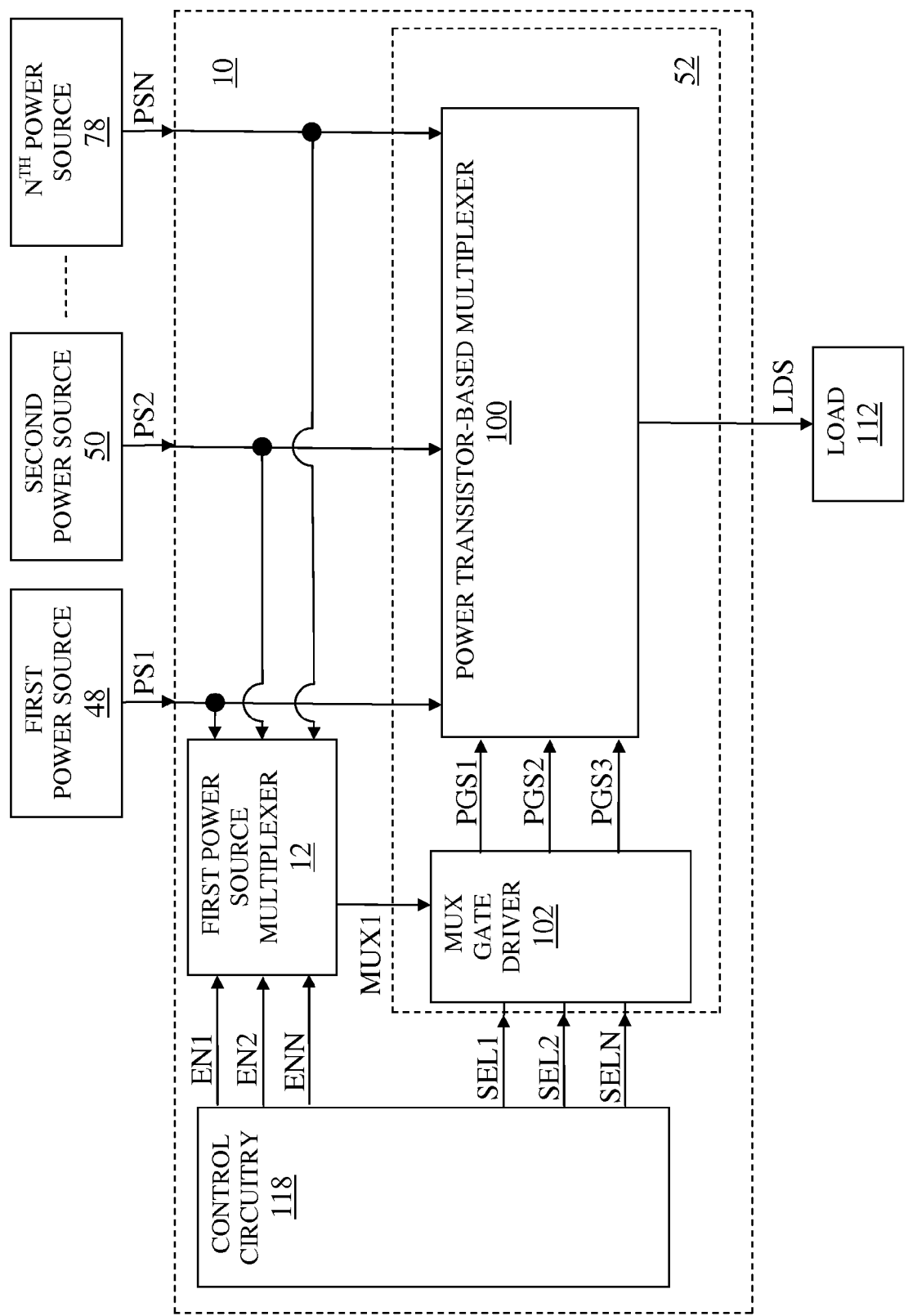
FIG. 9 shows the circuitry according to a further embodiment of the circuitry.

In general, the power transistor-based multiplexer 100 includes a group of power transistor elements 104, 106, 114. The group of power sources 48, 50, 78 provides the group of power source output signals PS1, PS2, PSN to the first power source multiplexer 12 and to the power transistor-based multiplexer 100. As such, the group of power sources 48, 50, 78 provides the group of power source output signals PS1, PS2, PSN to the group of power transistor elements 104, 106, 114. The first power source multiplexer 12 receives a group of enable signals EN1, EN2, ENN from control circuitry 118 (FIG. 9). The multiplexer gate driver 102 receives a group of select signals SEL1, SEL2, SELN from the control circuitry 118 (FIG. 9). The multiplexer gate driver 102 provides a group of power gate signals PGS1, PGS2, PGSN to the group of power transistor elements 104, 106, 114. The group of power transistor elements 104, 106, 114 includes a group of power transistor gates 108, 110, 116. As such, the multiplexer gate driver 102 provides the group of power gate signals PGS1, PGS2, PGSN to the group of power transistor gates 108, 110, 116.

The group of power sources 48, 50, 78 includes the first power source 48, the second power source 50, and up to and including the $N^{TH}$ power source 78. The first power transistor element 104 is coupled between the first power source 48 and the load 112. The second power transistor element 106 is coupled between the second power source 50 and the load 112. The $N^{TH}$ power transistor element 114 is coupled between the $N^{TH}$ power source 78 and the load 112. In general, each of the group of power transistor elements 104, 106, 114 is coupled between a corresponding one of the group of power sources 48, 50, 78 and the load 112.

Each of the group of power source output signals PS1, PS2, PSN has a corresponding one of the group of voltage magnitudes. As such, at least one of the group of power source output signals PS1, PS2, PSN has the maximum voltage magnitude. Further, each of the group of voltage magnitudes is less than or equal to the maximum voltage magnitude. In one embodiment of the multiplexer gate driver 102, a voltage swing at each of the group of power transistor gates 108, 110, 116 is about equal to the maximum voltage magnitude.

FIG. 9 shows the circuitry 10 according to a further embodiment of the circuitry 10. The circuitry 10 illustrated in FIG. 9 is similar to the circuitry 10 illustrated in FIG. 8, except the circuitry 10 illustrated in FIG. 9 further includes the control circuitry 118, which provides the group of enable signals EN1, EN2, ENN and the group of select signals SEL1, SEL2, SELN. In one embodiment of the control circuitry 118, the control circuitry 118 determines which of the group of voltage magnitudes has the maximum voltage magnitude. Then, the control circuitry 118 selects the maximum voltage magnitude from the group of voltage magnitudes by providing the group of enable signals EN1, EN2, ENN based on the selection of the maximum voltage magnitude. Providing the maximum voltage magnitude to the power transistor-based multiplexer 100 via the multiplexer gate driver 102 ensures proper operation of the power transistor-based multiplexer 100.

In one embodiment of the control circuitry 118, the control circuitry 118 selects one of the group of power source output signals PS1, PS2, PSN to be forwarded to the load 112 based on selection criteria. Then, the control circuitry 118 provides the group of select signals SEL1, SEL2, SELN based on the selected one of the group of power source output signals PS1, PS2, PSN to be forwarded to the load 112.

In an alternate embodiment of the circuitry 10, the $N^{TH}$ power source 78, the $N^{TH}$ power source output signal PSN, the $N^{TH}$ enable signal ENN, the $N^{TH}$ select signal SELN, the $N^{TH}$ power gate signal PGSN, and the $N^{TH}$ power transistor element 114 are omitted. As such, the control circuitry 118 determines which of the first voltage magnitude and the second voltage magnitude has the maximum voltage magnitude. The control circuitry 118 provides the first enable signal EN1 and the second enable signal EN2 based on the selection of the maximum voltage magnitude. The control circuitry 118 selects one of the first power source output signal PS1 and the second power source output signal PS2 to be forwarded to the load 112 based on selection criteria. The control circuitry 118 provides the first select signal SEL1 and the second select signal SEL2 based on the selected one of the first power source output signal PS1 and the second power source output signal PS2 to be forwarded to the load 112.

Figure 10:
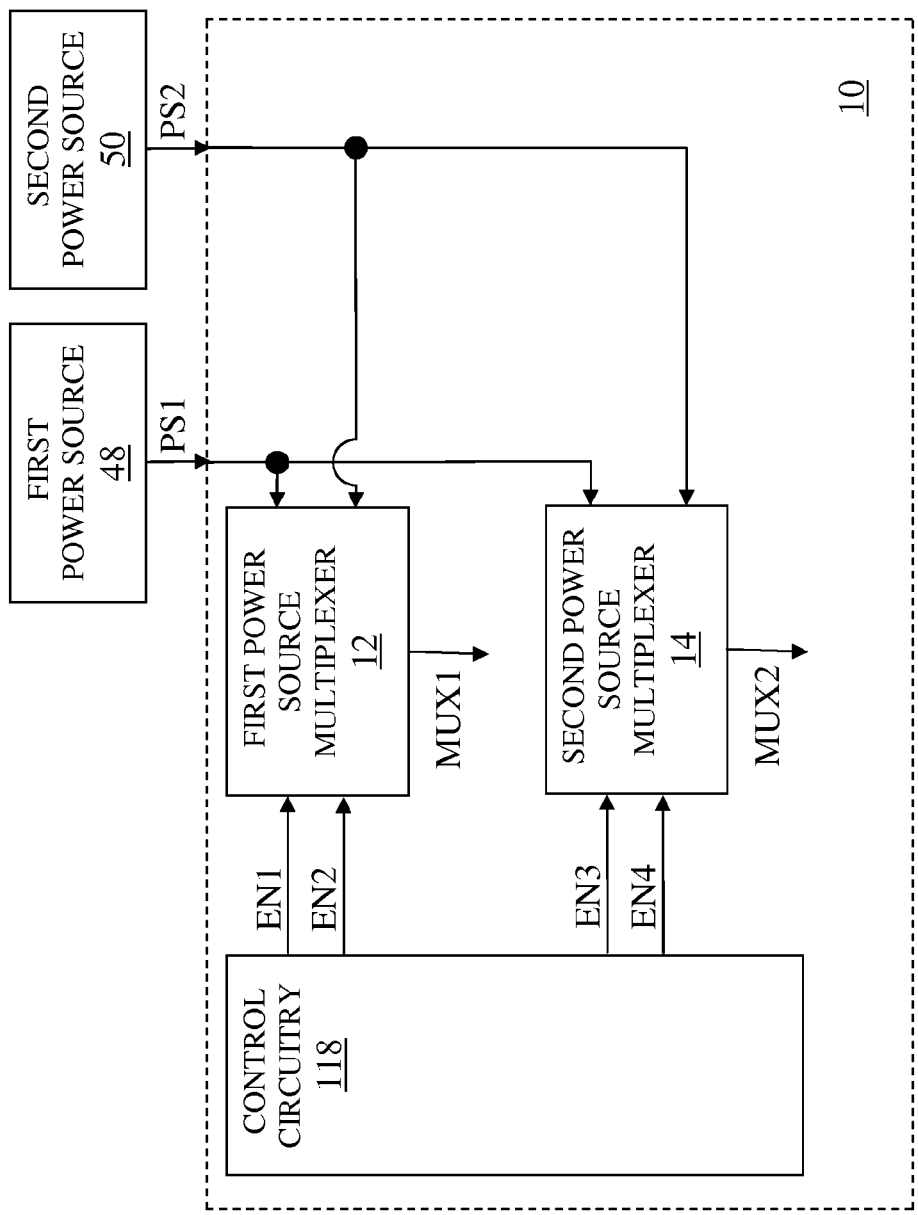
FIG. 10 shows the circuitry according to a supplemental embodiment of the circuitry.

FIG. 10 shows the circuitry 10 according to a supplemental embodiment of the circuitry 10. The circuitry 10 illustrated in FIG. 10 is similar to the circuitry 10 illustrated in FIG. 1, except the circuitry 10 illustrated in FIG. 10 further includes the control circuitry 118, which provides the first enable signal EN1, the second enable signal EN2, the third enable signal EN3, and the fourth enable signal EN4.

In a first embodiment of the control circuitry 118, the control circuitry 118 selects one of the first power source output signal PS1 and the second power source output signal PS2 to be forwarded by the first power source multiplexer 12 to provide the first multiplexer output signal MUX1 based on selection criteria. In a second embodiment of the control circuitry 118, the control circuitry 118 selects one of the first power source output signal PS1 and the second power source output signal PS2 to be forwarded by the second power source multiplexer 14 to provide the second multiplexer output signal MUX2 based on the selection criteria.

Figure 11:
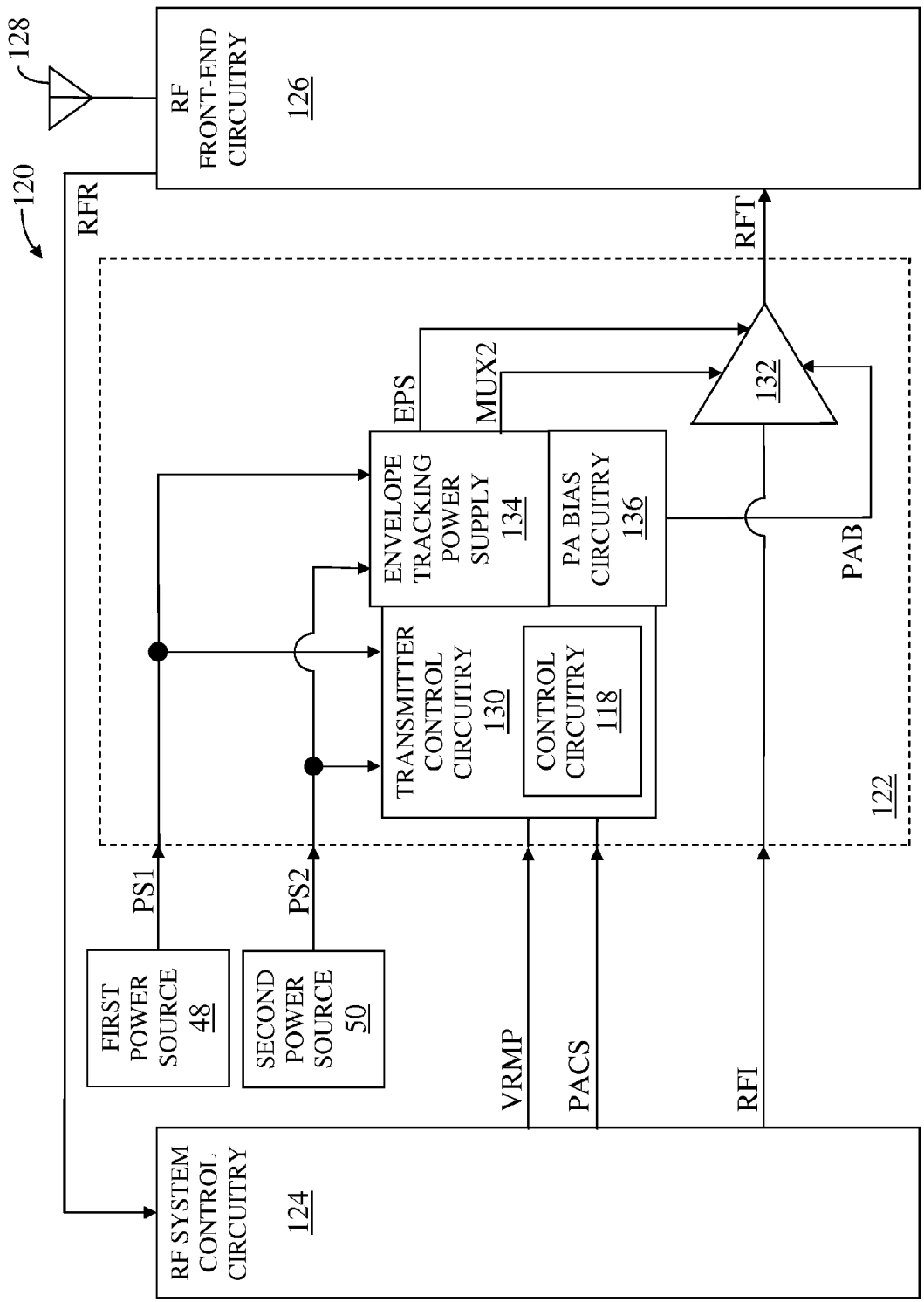
FIG. 11 shows radio frequency (RF) circuitry according to one embodiment of the present disclosure.

In one embodiment of the selection criteria, the selection criteria includes the first voltage magnitude and the second voltage magnitude. In one embodiment of the selection criteria, the selection criteria includes a bandwidth of a radio frequency (RF) power amplifier (PA) 132 (FIG. 11). In one embodiment of the selection criteria, the selection criteria includes a magnitude of an RF input signal RFI (FIG. 11) to the RF PA 132 (FIG. 11). In one embodiment of the selection criteria, the selection criteria includes a gain of the RF PA 132 (FIG. 11). In one embodiment of the selection criteria, the selection criteria includes any or all of the first voltage magnitude, the second voltage magnitude, the bandwidth of the RF PA 132 (FIG. 11), the gain of the RF PA 132 (FIG. 11), and the magnitude of the RF input signal RFI (FIG. 11) to the RF PA 132 (FIG. 11).

FIG. 11 shows RF circuitry 120 according to one embodiment of the RF circuitry 120. The RF circuitry 120 illustrated in FIG. 11 includes the circuitry 10 illustrated in FIG. 1 according to one embodiment of the RF circuitry 120. The RF circuitry 120 further includes RF transmitter circuitry 122, RF system control circuitry 124, RF front-end circuitry 126, an RF antenna 128, and the first power source 48. The RF transmitter circuitry 122 includes transmitter control circuitry 130, the RF PA 132, an envelope tracking power supply 134, and PA bias circuitry 136. In this regard, in one embodiment of the RF circuitry 120, the RF circuitry 120 illustrated in FIG. 11 is an RF communications system. In one embodiment of the transmitter control circuitry 130, the transmitter control circuitry 130 includes the control circuitry 118.

In one embodiment of the RF circuitry 120, the RF front-end circuitry 126 receives via the RF antenna 128, processes, and forwards an RF receive signal RFR to the RF system control circuitry 124. The RF system control circuitry 124 provides an envelope power supply control signal VRMP and a transmitter configuration signal PACS to the transmitter control circuitry 130. The RF system control circuitry 124 provides the RF input signal RFI to the RF PA 132. The first power source 48 provides the first power source output signal PS1 to the envelope tracking power supply 134 and to the transmitter control circuitry 130. In one embodiment of the first power source 48, the first power source 48 is the battery. The second power source 50 provides the second power source output signal PS2 to the envelope tracking power supply 134 and to the transmitter control circuitry 130. In one embodiment of the second power source 50, the second power source 50 is the DC-DC converter.

The transmitter control circuitry 130 is coupled to the envelope tracking power supply 134 and to the PA bias circuitry 136. The envelope tracking power supply 134 provides an envelope power supply signal EPS and the second multiplexer output signal MUX2 to the RF PA 132 based on the envelope power supply control signal VRMP. In one embodiment of the envelope tracking power supply 134, the first power source 48 and the second power source 50 provide power to the envelope tracking power supply 134 via the first power source output signal PS1 and the second power source output signal PS2, respectively. As such, the envelope power supply signal EPS is based on either the first power source output signal PS1 or the second power source output signal PS2. Similarly, the second multiplexer output signal MUX2 is based on either the first power source output signal PS1 or the second power source output signal PS2.

The envelope power supply control signal VRMP is representative of a setpoint of the envelope power supply signal EPS. The RF PA 132 receives and amplifies the RF input signal RFI to provide an RF transmit signal RFT using the envelope power supply signal EPS. The envelope power supply signal EPS and the second multiplexer output signal MUX2 provide power for amplification. In one embodiment of the RF PA 132, the envelope power supply signal EPS provides power for amplification to a final stage in the RF PA 132 and the second multiplexer output signal MUX2 provides power for amplification to a driver stage in the RF PA 132.

The RF front-end circuitry 126 receives, processes, and transmits the RF transmit signal RFT via the RF antenna 128. In one embodiment of the RF transmitter circuitry 122, the transmitter control circuitry 130 configures the RF transmitter circuitry 122 based on the transmitter configuration signal PACS. The PA bias circuitry 136 provides a PA bias signal PAB to the RF PA 132. In this regard, the PA bias circuitry 136 biases the RF PA 132 via the PA bias signal PAB. In one embodiment of the PA bias circuitry 136, the PA bias circuitry 136 biases the RF PA 132 based on the transmitter configuration signal PACS. In one embodiment of the RF front-end circuitry 126, the RF front-end circuitry 126 includes at least one RF switch, at least one RF amplifier, at least one RF filter, at least one RF duplexer, at least one RF diplexer, at least one RF amplifier, the like, or any combination thereof.

In one embodiment of the RF system control circuitry 124, the RF system control circuitry 124 is RF transceiver circuitry, which may include an RF transceiver IC, baseband controller circuitry, the like, or any combination thereof. In one embodiment of the RF transmitter circuitry 122, the envelope tracking power supply 134 provides the envelope power supply signal EPS, which has switching ripple. In one embodiment of the RF transmitter circuitry 122, the envelope power supply signal EPS provides power for amplification and envelope tracks the RF transmit signal RFT.

Figure 12:
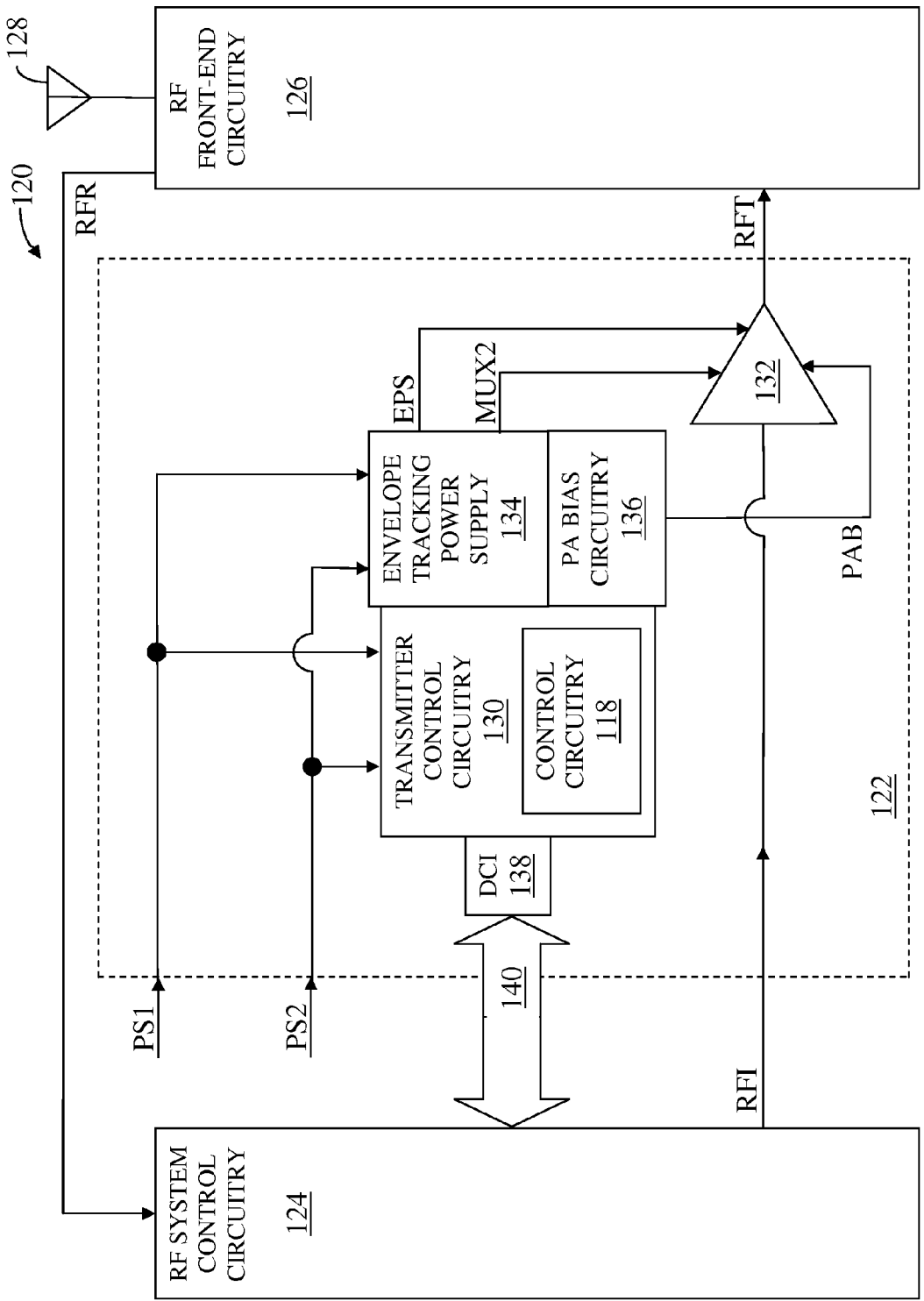
FIG. 12 shows the RF circuitry according to an alternate embodiment of the RF circuitry.

FIG. 12 shows the RF circuitry 120 according to an alternate embodiment of the RF circuitry 120. The RF circuitry 120 illustrated in FIG. 12 is similar to the RF circuitry 120 illustrated in FIG. 11, except in the RF circuitry 120 illustrated in FIG. 12, the RF transmitter circuitry 122 further includes a digital communications interface 138, which is coupled between the transmitter control circuitry 130 and a digital communications bus 140. The digital communications bus 140 is also coupled to the RF system control circuitry 124. As such, the RF system control circuitry 124 provides the envelope power supply control signal VRMP (FIG. 9) and the transmitter configuration signal PACS (FIG. 9) to the transmitter control circuitry 130 via the digital communications bus 140 and the digital communications interface 138.

Figure 13:
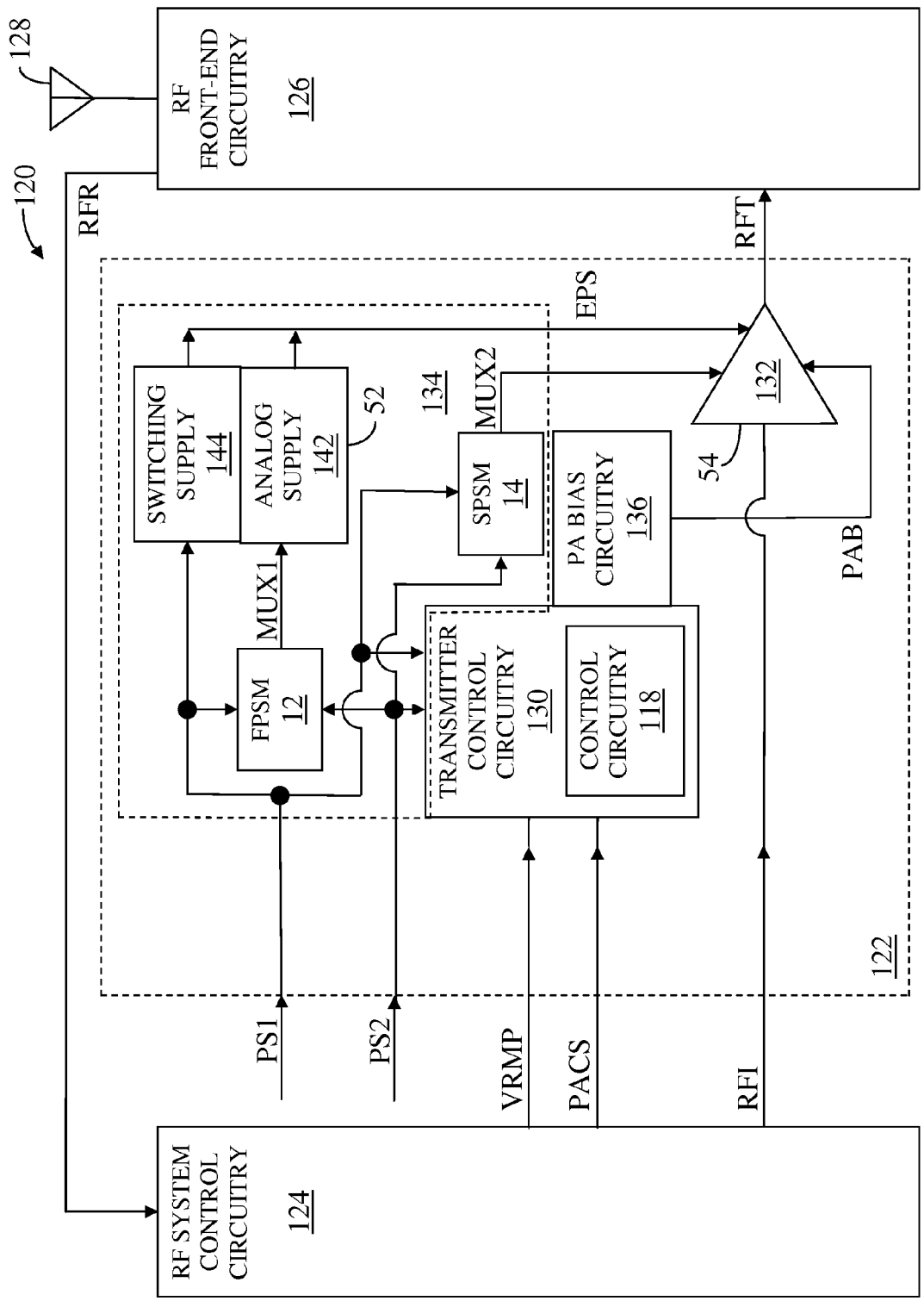
FIG. 13 shows details of an envelope tracking power supply illustrated in FIG. 11 according to one embodiment of the envelope tracking power supply.

FIG. 13 shows details of the envelope tracking power supply 134 illustrated in FIG. 11 according to one embodiment of the envelope tracking power supply 134. The envelope tracking power supply 134 includes the first power source multiplexer 12, the second power source multiplexer 14, an analog supply 142, and a switching supply 144. The transmitter control circuitry 130 controls the first power source multiplexer 12, the second power source multiplexer 14, the analog supply 142, and the switching supply 144. The analog supply 142 and the switching supply 144 provide the envelope power supply signal EPS, such that the analog supply 142 partially provides the envelope power supply signal EPS and the switching supply 144 partially provides the envelope power supply signal EPS. The switching supply 144 may provide power more efficiently than the analog supply 142. However, the analog supply 142 may provide the envelope power supply signal EPS more accurately than the switching supply 144. As such, the analog supply 142 regulates a voltage of the envelope power supply signal EPS based on the setpoint of the envelope power supply signal EPS, and the switching supply 144 operates to drive an output current from the analog supply 142 toward zero to maximize efficiency. In this regard, the analog supply 142 behaves like a voltage source and the switching supply 144 behaves like a current source.

Those skilled in the art will recognize improvements and modifications to the embodiments of the present disclosure. All such improvements and modifications are considered within the scope of the concepts disclosed herein and the claims that follow.

What is claimed is:
1. Circuitry comprising:
a first switching transistor element having a first gate;
a second switching transistor element having a second gate;
a third switching transistor element having a third gate; and
a fourth switching transistor element having a fourth gate, wherein:
the first switching transistor element and the third switching transistor element are coupled in series between a first power source and a first downstream circuit;
the second switching transistor element and the fourth switching transistor element are coupled in series between a second power source and the first downstream circuit;
when a first gate signal is presented to the first gate, a voltage swing at the first gate is about equal to a first voltage magnitude;
when a second gate signal is presented to the second gate, a voltage swing at the second gate is about equal to the first voltage magnitude;
when a third gate signal is presented to the third gate, a voltage swing at the third gate is about equal to a second voltage magnitude;
when a fourth gate signal is presented to the fourth gate, a voltage swing at the fourth gate is about equal to the second voltage magnitude;
the first power source is adapted to provide a first output voltage having the first voltage magnitude; and
the second power source is adapted to provide a second output voltage having the second voltage magnitude; wherein the first voltage magnitude is not equal to the second voltage magnitude.

2. The circuitry of claim 1 further comprising a plurality of series couplings wherein:
each of the plurality of series couplings comprises a corresponding plurality of switching transistor elements coupled in series between a corresponding one of a plurality of power sources and the first downstream circuit;
the plurality of series couplings comprises a first series coupling and a second series coupling;
the first series coupling comprises the first switching transistor element and the third switching transistor element;
the second series coupling comprises the second switching transistor element and the fourth switching transistor element; and
the plurality of power sources comprises the first power source and the second power source.

3. The circuitry of claim 2 further comprising a plurality of power transistor elements, wherein each of the plurality of power transistor elements is coupled between a corresponding one of the plurality of power sources and a load.

4. The circuitry of claim 1 wherein a first power source multiplexer comprises the first switching transistor element, the second switching transistor element, the third switching transistor element, and the fourth switching transistor element.

5. The circuitry of claim 1 wherein each of the first switching transistor element, the second switching transistor element, the third switching transistor element, and the fourth switching transistor element is a P-type field effect transistor (PFET) transistor element.

6. The circuitry of claim 1 wherein each of the first switching transistor element, the second switching transistor element, the third switching transistor element, and the fourth switching transistor element is an N-type field effect transistor (NFET) transistor element.

7. The circuitry of claim 1 wherein the first power source is a battery.

8. The circuitry of claim 7 further comprising the battery.

9. The circuitry of claim 1 wherein the second power source is a DC-DC converter.

10. The circuitry of claim 9 wherein the DC-DC converter is adapted to use charge pump based DC-DC conversion.

11. The circuitry of claim 9 wherein the DC-DC converter is adapted to use inductor based DC-DC conversion.

12. The circuitry of claim 9 wherein the DC-DC converter is adapted to use both charge pump based and inductor based DC-DC conversion.

13. The circuitry of claim 9 further comprising the DC-DC converter.

14. The circuitry of claim 1 wherein the first voltage magnitude is about equal to the second voltage magnitude.

15. The circuitry of claim 1 wherein the first voltage magnitude is greater than the second voltage magnitude.

16. The circuitry of claim 1 wherein the first voltage magnitude is less than the second voltage magnitude.

17. The circuitry of claim 1 further comprising a power transistor-based multiplexer, which comprises:
a first power transistor element having a first power transistor gate; and
a second power transistor element having a second power transistor gate, wherein:
the first power transistor element is coupled between the first power source and a load;
the second power transistor element is coupled between the second power source and the load;
when a first power gate signal is presented to the first power transistor gate, a voltage swing at the first power transistor gate is about equal to a maximum voltage magnitude, which is about equal to one selected from a group consisting of the first voltage magnitude and the second voltage magnitude; and
when a second power gate signal is presented to the second power transistor gate, a voltage swing at the second power transistor gate is about equal to the maximum voltage magnitude.

18. The circuitry of claim 17 further comprising a first power source multiplexer, wherein:
the first power source multiplexer comprises the first switching transistor element, the second switching transistor element, the third switching transistor element, and the fourth switching transistor element;
the first power source multiplexer is adapted to provide a first multiplexer output signal to the first downstream circuit; and
the first multiplexer output signal has the maximum voltage magnitude.

19. The circuitry of claim 17 further comprising the first downstream circuit, wherein:
the first downstream circuit comprises the power transistor-based multiplexer and a multiplexer gate driver; and
the multiplexer gate driver is adapted to receive and forward a first multiplexer output signal to a selected one of the first power transistor element and the second power transistor element.

20. The circuitry of claim 19 wherein:
a first power source multiplexer is adapted to receive a first enable signal and a second enable signal;
the first power source multiplexer is further adapted to select the maximum voltage magnitude based on the first enable signal and the second enable signal;
the multiplexer gate driver is further adapted to receive a first select signal and a second select signal; and
the multiplexer gate driver is further adapted to select the one of the first power transistor element and the second power transistor element based on the first select signal and the second select signal.

21. The circuitry of claim 20 further comprising control circuitry adapted to:
determine which of the first voltage magnitude and the second voltage magnitude has the maximum voltage magnitude;
provide the first enable signal and the second enable signal based on the selection of the maximum voltage magnitude;
select one of a first power source output signal and a second power source output signal to be forwarded to the load based on selection criteria; and
provide the first select signal and the second select signal based on the selected one of the first power source output signal and the second power source output signal to be forwarded to the load.

22. The circuitry of claim 1 further comprising a first power source multiplexer, wherein:
the first power source multiplexer comprises the first switching transistor element, the second switching transistor element, the third switching transistor element, and the fourth switching transistor element;
the first power source multiplexer further comprises a first gate driver, a second gate driver, a third gate driver, and a fourth gate driver;
the first gate driver is coupled to the first gate;
the second gate driver is coupled to the second gate;
the third gate driver is coupled to the third gate; and
the fourth gate driver is coupled to the fourth gate.

23. The circuitry of claim 22 wherein:
the first power source is adapted to provide a first power source output signal, which has a first output voltage having the first voltage magnitude;
the second power source is adapted to provide a second power source output signal, which has a second output voltage having the second voltage magnitude;
the first gate driver is adapted to provide a first gate signal to the first gate based on a first enable signal and the first power source output signal;
the second gate driver is adapted to provide a second gate signal to the second gate based on a second enable signal and the first power source output signal;
the third gate driver is adapted to provide a third gate signal to the third gate based on the first enable signal and the second power source output signal; and
the fourth gate driver is adapted to provide a fourth gate signal to the fourth gate based on the second enable signal and the second power source output signal.

24. The circuitry of claim 22 further comprising control circuitry, wherein:
the first power source is adapted to provide a first power source output signal, which has a first output voltage having the first voltage magnitude;
the second power source is adapted to provide a second power source output signal, which has a second output voltage having the second voltage magnitude;
the control circuitry is adapted to select one of the first power source output signal and the second power source output signal based on selection criteria; and
the first power source multiplexer is adapted to receive and forward the selected one of the first power source output signal and the second power source output signal to provide a first multiplexer output signal.

25. The circuitry of claim 24 wherein the selection criteria comprises the first voltage magnitude and the second voltage magnitude.

26. The circuitry of claim 24 wherein the selection criteria comprises a bandwidth of a radio frequency (RF) input signal to an RF power amplifier.

27. The circuitry of claim 24 wherein the selection criteria comprises a magnitude of a radio frequency (RF) input signal to an RF power amplifier.

28. The circuitry of claim 24 wherein the selection criteria comprises a gain of a radio frequency (RF) power amplifier.

29. The circuitry of claim 1 wherein each of the first switching transistor element, the second switching transistor element, the third switching transistor element, and the fourth switching transistor element is an enhancement mode field effect transistor element.

\* \* \* \* \*